(12) United States Patent
Bench et al.

(10) Patent No.: US 12,105,167 B1
(45) Date of Patent: Oct. 1, 2024

(54) BURIED UTILITY LOCATOR AUTO-TUNING APPARATUS AND METHODS

(71) Applicant: SeeScan, Inc., San Diego, CA (US)

(72) Inventors: Stephanie M. Bench, Sandersville, GA (US); Mark S. Olsson, La Jolla, CA (US); Jan Soukup, San Diego, CA (US)

(73) Assignee: SeeScan, Inc., San Diego, CA (US)

( * ) Notice: Subject to any disclaimer, the term of this patent is extended or adjusted under 35 U.S.C. 154(b) by 0 days.

(21) Appl. No.: 18/135,002

(22) Filed: Apr. 14, 2023

Related U.S. Application Data

(63) Continuation of application No. 17/540,231, filed on Dec. 2, 2021, now Pat. No. 11,635,479, which is a continuation of application No. 16/921,775, filed on Jul. 6, 2020, now Pat. No. 11,243,278.

(60) Provisional application No. 62/870,443, filed on Jul. 3, 2019.

(51) Int. Cl.
  *G01R 33/36* (2006.01)
  *G01V 3/10* (2006.01)
  *G01V 3/17* (2006.01)

(52) U.S. Cl.
  CPC ..... *G01R 33/3628* (2013.01); *G01R 33/3678* (2013.01); *G01V 3/10* (2013.01); *G01V 3/17* (2013.01)

(58) Field of Classification Search
  CPC .. G01R 33/3628; G01R 33/3678; G01V 3/10; G01V 3/17
  USPC ........................................................ 324/314
  See application file for complete search history.

(56) References Cited

U.S. PATENT DOCUMENTS

| | | | | |
|---|---|---|---|---|
| 7,443,154 | B1 * | 10/2008 | Merewether | G01V 3/165 |
| | | | | 324/67 |
| 7,741,848 | B1 * | 6/2010 | Olsson | G01V 3/102 |
| | | | | 702/76 |
| 8,264,226 | B1 * | 9/2012 | Olsson | G01V 3/10 |
| | | | | 324/67 |
| 2007/0004362 | A1 | 1/2007 | Der et al. | |
| 2011/0202277 | A1 * | 8/2011 | Haddad | G01S 13/9027 |
| | | | | 702/14 |
| 2014/0320133 | A1 * | 10/2014 | Olsson | G01V 3/10 |
| | | | | 324/329 |

(Continued)

FOREIGN PATENT DOCUMENTS

| | | | | |
|---|---|---|---|---|
| EP | 565178 A1 * | 10/1993 | | G01R 33/3678 |
| WO | WO-9002342 A * | 3/1990 | | G01R 33/34046 |
| WO | 2017143090 A1 | 8/2017 | | |

OTHER PUBLICATIONS

Guo, Ben, et al. "Novel Actively Tuned Resonant Filter Based Buck Converter Using Tunable Capacitor." 2018 IEEE Energy Conversion Congress and Exposition (ECCE). IEEE, 2018. (Year: 2018).*

(Continued)

*Primary Examiner* — Christopher P McAndrew
(74) *Attorney, Agent, or Firm* — Steven C. Tietsworth, Esq.; Michael J. Pennington, Esq.

(57) ABSTRACT

Signal generation devices including an auto-tuning electronic circuit module for generating tuned output signals are disclosed. The auto-tuning electronic circuit module may include a tunable resonant electronic circuit element for providing a tuned output signal, including a voltage divider element and a tuning array element and control element.

15 Claims, 10 Drawing Sheets

(56) References Cited

U.S. PATENT DOCUMENTS

| | | | | |
|---|---|---|---|---|
| 2016/0003961 A1* | 1/2016 | Olsson | ............... | G01V 3/104 |
| | | | | 324/326 |
| 2017/0299757 A1* | 10/2017 | Bench | ................ | G01V 3/165 |
| 2017/0323580 A1* | 11/2017 | Haddy | ................ | G01V 3/15 |
| 2017/0363764 A1* | 12/2017 | Aldridge | .............. | G01V 3/08 |
| 2018/0074221 A1* | 3/2018 | Reiderman | ......... | G01N 24/081 |
| 2018/0172868 A1* | 6/2018 | Branson | ............... | G01V 3/10 |

OTHER PUBLICATIONS

International Searching Authority, "Written Opinion of the International Searching Authority" for PCT Patent Application PCT/US20/40933, Jan. 7, 2021, European Patent Office, Munich.

* cited by examiner

BURIED UTILITY LOCATOR AUTO-TUNING APPARATUS AND METHODS

CROSS-REFERENCE TO RELATED APPLICATIONS

This application claims priority under 35 U.S.C. § 119 (e) to U.S. Provisional Patent Application Ser. No. 62/870,443, entitled AUTOTUNING MODULES, filed on Jul. 3, 2019, the content of which is hereby incorporated by reference herein in its entirety for all purposes.

FIELD

This disclosure relates generally to auto-tuning electronic circuit modules for generating tuned output signals. More specifically, but not exclusively, this disclosure relates to auto-tuning circuit modules for generating tuned output signals in magnetic field sensing buried utility locating devices and systems.

BACKGROUND

System and devices that may include circuits for generating output signals are well known in the art. Often these devices require the signals to be at a tuned frequency which are typically implemented using various LC or resonant circuits having different topologies to achieve tuning. Resonant circuit topologies for generating a signal at a tuned frequency may either be "tuned," generating a signal at a particular tuned frequency, or "tunable," having adjustable elements to achieve one or more tuned frequencies. For example, a tuned resonant circuit relies on the inherent tuning of networks of capacitors and inductors, with the input signal driving the circuit to achieve the tuned output signal. In contrast, a tunable resonant circuit may be implemented using adjustable elements to achieve the tuned output signal in addition to the inherent tuning of capacitors, inductors, and input signals driving the circuit.

Existing tuned resonant circuit topologies may experience inaccuracies in output signal tuning due to quality limitations and/or component tolerances of the inductors and capacitors used. For example, these electronic circuit components may be imprecise in initial tolerance (i.e., L or C values) and/or, over time, may degrade and drift in tuning, resulting in improperly or inaccurately tuned output signals due to tuned frequency drift as a result of component variations. Likewise, in many applications, tuned resonant circuit topologies may be particularly lossy as high current input is required to generate the desired tuned output signal frequency.

A tunable resonant circuit topology is often preferred as tunable circuits are typically designed to compensate for the inaccuracy problems associated with variation in inductor and capacitor parameter values in fixed tuned resonant circuits. In many applications, tuning may be implemented via a user manually manipulating one or more tuning capacitors in the circuitry. The manual tuning of resonant circuits is cumbersome, time consuming, and can results in improper or inaccurately tuned output signals due to human error. Such tunable resonant circuit topologies, particularly wherein the circuit aims to achieve a high quality or Q factor, often require many expensive components such as high current and/or high voltage tuning capacitors which results in a large physical package to attempt to achieve precise tuning. As a result, precision tuning tends to come at the cost of added expense and size to a signal generating device includes a high precision tunable resonant circuit.

In some utility locating system devices known in the art, for example in a utility frequency identification excitation device (also referred to herein as "utility frequency identification device" or "UFID" exciters or transceivers) and/or other signal transmitter or inductive devices, various resonant circuits may have varying topologies that are used to generate and broadcast one or more tuned output signals. In such applications, precisely tuned output signals may be a prerequisite for efficiently and accurately locating and mapping utility lines (i.e., detection by sensing and processing magnetic field signals emitted from the utility or an associated device such as a dipole magnetic field generating sonde, also denoted here in just a "sonde" for brevity). High accuracy in knowing the precise location of utilities beneath the ground surface is necessary to avoid costly destruction to infrastructure and potential harm to human wellbeing such, for example, to avoid rupturing a buried water line, high voltage line, or natural gas line.

In other prior art devices, frequency tuning of resonant circuits may be implemented using automatic tuning topologies and circuitry. Existing automatic tuning resonant circuits may likewise fail to achieve sufficiently accurate tuning, particularly in high Q factor circuits. Furthermore, auto-tuning resonant circuits known in the art are not optimized for use in utility locating systems and devices. For example, utility locating system devices may be used in a variety of scenarios that may interfere with the tuning of the output signal, such as varying temperatures, differences in soil conditions, rain and moisture, as well as the presence of pipes and/or rebar and/or other conductive elements in the locating environment.

Accordingly, there is a need in the art to address the above-described as well as other problems in the art.

SUMMARY

This disclosure relates generally to auto-tuning modules for generating tuned output signals. More specifically, but not exclusively, this disclosure relates to auto-tuning modules for generating tuned output current signals for use in various buried utility locating devices and systems such as utility locating transmitter, induction sticks and other induction devices, sondes, and other signal generation devices.

According to one aspect, the disclosure is directed to an auto-tuning module for generating tuned output signals. The auto-tuning module may include a tunable resonant circuit element having a first capacitor and an inductor in series driven by an input signal which may be a square wave at a resonant frequency. The tunable resonant circuit element may further include a capacitive voltage divider element comprising a pair of capacitors on a branch tapped between the first capacitor and inductor. The tunable resonant circuit element may further include a tuning array element having a plurality of switched capacitors on a branch tapped between the capacitors of the capacitive voltage divider where each capacitor in the tuning array element is rated for increasingly scaled capacitance further from the capacitive voltage divider. The auto-tuning module may further include a control element having a sensing element for measuring output signal strength and a processing element for comparing output signal strength values in a non-transitory memory element and controlling switched capacitors to tune the successive output signal.

In another aspect, the disclosure is directed to an auto-tuning module for generating tuned output signals. The auto-tuning module may include a symmetrical tunable resonant circuit element having an inductor between two pairings of capacitors where the circuit is driven by an input signal which may be single-ended pulse. The symmetrical tunable resonant circuit element may further include a pair of symmetrical capacitive voltage dividers each comprising a pair of capacitors on a branch tapped between each pair of capacitors on either side of the inductor. The symmetrical tunable resonant circuit element may further include a pair symmetrical tuning array element having a plurality of switched capacitors on a branch tapped between the capacitors of each capacitive voltage divider where each capacitor in the tuning array element is rated for increasingly scaled capacitance further from the capacitive voltage divider. The auto-tuning module may further include a control element including a sensing element for measuring output signal strength and a processing element for comparing output signal strength values in a non-transitory memory element and controlling switched capacitors to tune the successive output signal.

In another aspect, the disclosure is directed to an auto-tuning module for generating tuned output signals. The auto-tuning module may include a multistage tunable resonant circuit that includes an inductor and a number of coils in series each separated by a capacitor in parallel and driven by an input signal. The multistage tunable resonant circuit may further include a number of tuning stage elements wherein each tuning stage element is in a one to one transformer arrangement with one coil. Each tuning stage element may further include a first capacitor and a coil (which may form the tuning stage side of the transformer) in series driven by an input signal which may be a square wave at the resonant frequency. The tuning stage element may further include a capacitive voltage divider comprising a pair of capacitors on a branch tapped between the first capacitor and coil. The tuning stage element may further include a tuning array element having a plurality of switched capacitors on a branch tapped between the capacitors of the capacitive voltage divider where each capacitor in the tuning array element is rated for increasingly scaled capacitance further from the capacitive voltage divider. The auto-tuning module may further include a control element including a sensing element for measuring output signal strength and a processing element for comparing output signal strength values in a non-transitory memory element and controlling switched capacitors to tune the successive output signal.

In another aspect, the disclosure is directed to a method for generating a tuned signal. The method may have a first step of generating an input signal to drive the tunable resonant circuit element. In another step, the method may include measuring the output signal strength and storing the value in non-transitory memory. In another step, the method may include actuating one tuning capacitor by closing one switch in the tuning element array. In another step, the method may again include measuring the output signal strength and storing the value in non-transitory memory. The method may further include a step or steps comparing output signal strength values and continuing to actuate tuning capacitors by closing one or more switches in the tuning element array until signal strength has decreased. In another step, the method may include opening the last closed switch to revert back to the optimized signal strength.

In another aspect, the disclosure is directed to a method for tuning an output signal when tuning drift has been detected. The method may have a first step of determining tuning drift by measuring the output signal strength and storing the value in non-transitory memory. In another step, the method may include actuating one tuning capacitor by closing one switch in the tuning element array. In another step, the method may again include measuring the output signal strength and storing the value in non-transitory memory. The method may further include a step or steps if there has been improvement in output signal strength values and continuing to close switches or if there is a worsening of output signal strength values and opening switches until tuning is achieved.

In another aspect, the disclosure is directed to a signal generation device including an auto-tuning electronic circuit module for generating tuned output signals. The auto-tuning electronic circuit module may include, for example, a tunable resonant electronic circuit element for providing a tuned output signal, including a voltage divider element and a tuning array element and a control element. The control element may include, for example, a sensing element for measuring output signal strength and a processing element for comparing previous output signal strength values stored in a non-transitory memory element to a current signal strength value and providing a corresponding control signal to tune the tunable resonant electronic circuit. The control element may further provide, as an output, an input signal to drive the tunable resonant electronic circuit element.

In another aspect, the disclosure is directed to an auto-tuning electronic circuit module for generating tuned output signals. The electronic circuit module may include, for example, a tunable resonant electronic circuit element for providing a tuned output signal, including a voltage divider element and a tuning array element and a control element including a sensing element for measuring output signal strength. The electronic circuit module may also include a processing element for comparing previous output signal strength values stored in a non-transitory memory element to a current signal strength value and providing a corresponding control signal to tune the tunable resonant electronic circuit and/or an input signal to drive the tunable resonant electronic circuit element. The tunable resonant circuit element may include an inductor and a first capacitor in series driven by an input signal at a resonant frequency, with one lead of the inductor coupled to a ground and one lead of the first capacitor coupled to receive the input signal from the input signal generator circuit output from a first lead, and wherein a second lead of the input signal generator circuit output is coupled to the ground. The voltage divider element may include a capacitive voltage divider circuit coupled between the inductor and first capacitor, comprising a second capacitor dividing against a third capacitor, and a tuning array element including a plurality of switched capacitors and associated switches on a circuit branch tapped from between the first and second capacitors of the capacitive voltage divider. The plurality of capacitors switched on or off by the switches may have capacitance values to increase or decrease the aggregate capacitance during tuning based on the control signal from the control element. The plurality of switched capacitors may be arranged in the tuning array element so as to be switched on by the switches based on increasing capacitance value during tuning. The voltage rating of ones of the switched capacitors may progressively decrease in value as the capacitance increases in value so as to reduce the aggregate switching capacitors' physical size.

In another aspect, the disclosure is directed to a method for automatically tuning frequency in a utility locating device current signal generator. The method may include, for example, one or more of the steps of providing, from a control element, an input signal to a tunable resonant circuit, measuring a first signal strength of an output signal from the tunable resonant circuit, storing the measured first signal strength in a non-transitory memory element, switching on one switched capacitor of a plurality of switched capacitors in the tunable resonant circuit, measuring a second, subsequent signal strength of the output signal, comparing the stored first measured output signal strength measurement with the second output signal strength measurement, and/or switching another of the switched capacitors responsive to the comparison.

Various additional aspects, features, devices, systems, and functionality are further described below in conjunction with the appended Drawings.

BRIEF DESCRIPTION OF THE DRAWINGS

The present application may be more fully appreciated in connection with the following detailed description taken in conjunction with the accompanying Drawings, wherein.

DESCRIPTION OF EMBODIMENTS

Terminology

Figure 1:
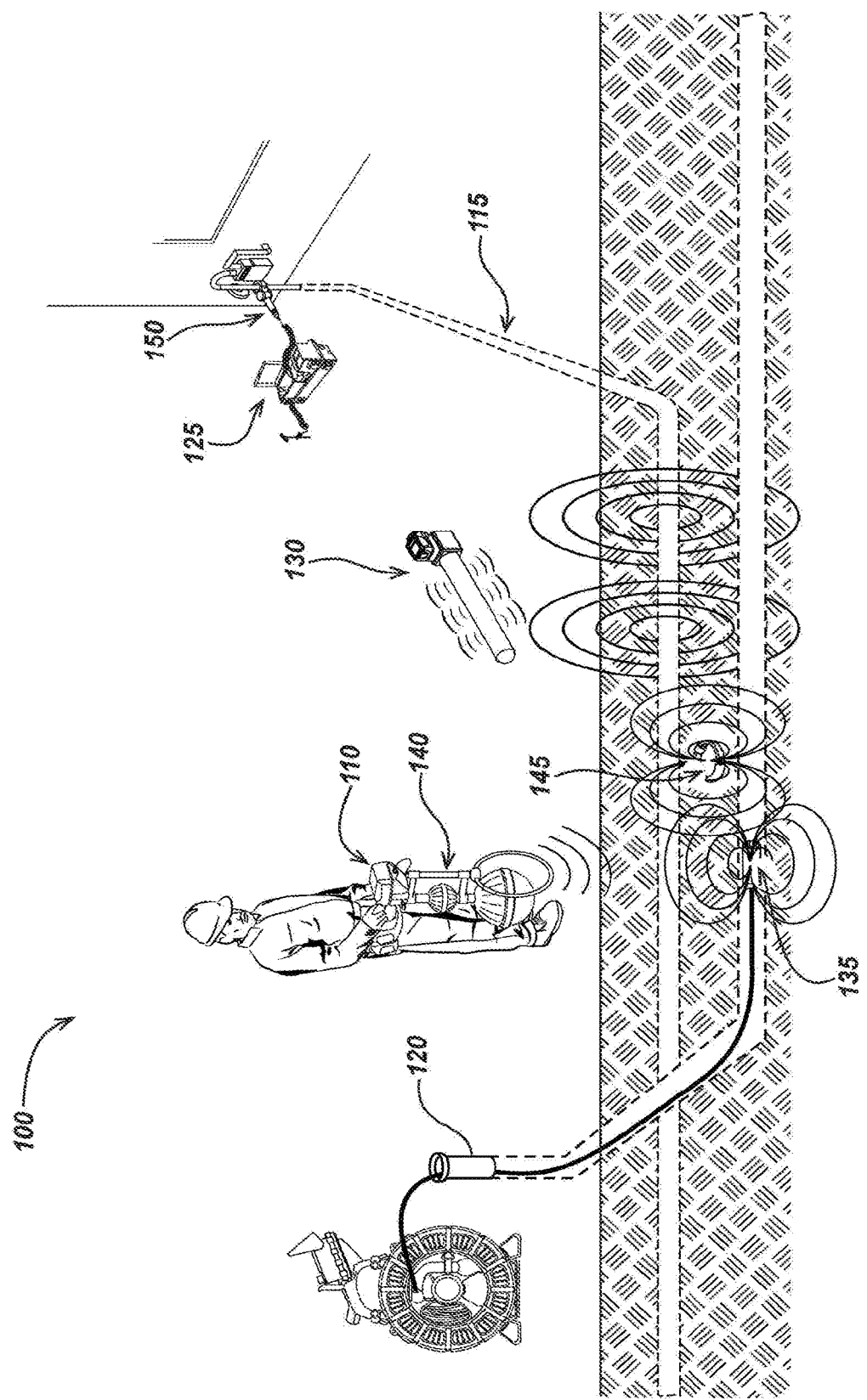
FIG. 1 illustrates an example buried utility locating system with multiple signal generating devices including one or more auto-tuning modules in accordance with aspects of the disclosure.

As used herein, the term "output signal" may refer to the resulting signal at a tuned frequency resulting from an "input signal" that may drive the circuit.

The term "tuned resonant circuit element" or "tuned resonant circuit" may refer to a resonant circuit topology wherein the circuit may rely upon the inherent tuning of capacitors, inductors, and input signal driving the circuit to achieve the tuned output signal. The term "tunable resonant circuit element" or "tunable resonant circuit" may refer to a resonant circuit topology having some adjustable elements to achieve the tuned output signal in addition to the inherent tuning of capacitors, inductors, and input signal driving the circuit.

The term "locating device" may include any device or system configured to determine the position and orientation of one or more utility lines which may be buried in the ground. In some embodiments, the utility position and orientation estimating devices may be or include one or more "magnetic field sensing locating devices" also referred to herein as "utility locators," "utility locator devices," "utility locating devices," and "locators." Such magnetic field sensing locating devices may refer to devices for sensing and measuring "signals" or radiation of electromagnetic energy. The magnetic field sensing locating devices herein may further process the received signals to determine information about hidden or buried conductors (e.g., underground utilities such as pipes, conduits, or cables) and the associated underground environment, which may be done at discrete points in the surveyed area.

The term "buried utilities" or "utility lines" or "utility" as used herein refers not only to utilities below the surface of the ground, but also to utilities that are otherwise obscured, covered, or hidden from direct view or access (e.g. overhead power lines, underwater utilities, and the like).

Overview

This disclosure relates generally to auto-tuning modules for generating tuned output signals. More specifically, but not exclusively, this disclosure relates to auto-tuning modules for generating tuned output signals used in various utility locating devices and systems.

According to one aspect, the disclosure is directed to an auto-tuning module for generating tuned output signals. The auto-tuning module may include a tunable resonant circuit element having a first capacitor and an inductor in series driven by an input signal which may be a square wave at a resonant frequency. The tunable resonant circuit element may further include a capacitive voltage divider element comprising a pair of capacitors on a branch tapped between the first capacitor and inductor. The tunable resonant circuit element may further include a tuning array element having a plurality of switched capacitors on a branch tapped between the capacitors of the capacitive voltage divider where each capacitor in the tuning array element is rated for increasingly scaled capacitance further from the capacitive voltage divider. The auto-tuning module may further include a control element having a sensing element for measuring output signal strength and a processing element for comparing output signal strength values and controlling switched capacitors to tune the successive output signal.

In another aspect, the disclosure is directed to an auto-tuning module for generating tuned output signals. The auto-tuning module may include a symmetrical tunable resonant circuit element having an inductor between two pairings of capacitors where the circuit is driven by an input signal which may be single-ended pulse. The symmetrical tunable resonant circuit element may further include a pair of symmetrical capacitive voltage dividers each comprising a pair of capacitors on a branch tapped between each pair of capacitors on either side of the inductor. The symmetrical tunable resonant circuit element may further include a pair of symmetrical tuning array elements having a plurality of switched capacitors on a branch tapped between the capacitors of each capacitive voltage divider where each capacitor in the tuning array element is rated for increasingly scaled capacitance further from the capacitive voltage divider. The auto-tuning module may further include a control element including a sensing element for measuring output signal strength and a processing element for comparing output signal strength values and controlling switched capacitors to tune the successive output signal.

In another aspect, the disclosure is directed to an auto-tuning module for generating tuned output signals. The auto-tuning module may include a multistage tunable resonant circuit that includes an inductor and a number of coils in series each separated by a capacitor in parallel and driven by an input signal. The multistage tunable resonant circuit may further include a number of tuning stage elements wherein each tuning stage element is in a one to one transformer arrangement with one coil. Each tuning stage element may further include a first capacitor and a coil (which may form the tuning stage side of the transformer) in series driven by an input signal which may be a square wave at the resonant frequency. The tuning stage element may further include a capacitive voltage divider comprising a pair of capacitors on a branch tapped between the first capacitor and coil. The tuning stage element may further include a tuning array element having a plurality of switched capacitors on a branch tapped between the capacitors of the capacitive voltage divider where each capacitor in the tuning array element is rated for increasingly scaled capacitance further from the capacitive voltage divider. The auto-tuning module may further include a control element including a sensing element for measuring output signal strength and a processing element for comparing output signal strength values and controlling switched capacitors to tune the successive output signal.

In another aspect, the disclosure is directed to a method for generating a tuned signal. The method may have a first step of generating an input signal to drive the tunable resonant circuit element. In another step, the method may include measuring the output signal strength and storing the value in non-transitory memory. In another step, the method may include actuating one tuning capacitor by closing one switch in the tuning element array. In another step, the method may again include measuring the output signal strength and storing the value in non-transitory memory. The method may further include a step or steps comparing output signal strength values and continuing to actuate tuning capacitors by closing one or more switches in the tuning element array until signal strength has decreased. In another step, the method may include opening the last closed switch to revert back until the optimum signal strength is reached.

In another aspect, the disclosure is directed to a method for tuning an output signal when tuning drift has been detected. The method may have a first step of determining tuning drift by measuring the output signal strength and storing the value in non-transitory memory. In another step, the method may include actuating one tuning capacitor by closing one switch in the tuning element array. In another step, the method may again include measuring the output signal strength and storing the value in non-transitory memory. The method may further include a step or steps if there has been improvement in output signal strength values and continuing to close switches or if there is a worsening of output signal strength values and opening switches until tuning is achieved.

In another aspect, the auto-tuning method may include compensation for tuning drift that may occur due to temperature variation.

In another aspect, the auto-tuning method may include compensation for tuning drift due to component degradation over time.

In another aspect, the auto-tuning method may include compensation for tuning drift caused by local environmental condition. For instance, the local environmental conditions may include the device being buried beneath the ground's surface, soil conditions, moisture present in the surrounding environment, and/or the presence of conductive objects.

In another aspect, the auto-tuning modules disclosed herein may be disposed in one or more utility locating system devices. Exemplary utility locating devices may include, but are not limited to, transmitter devices, induction sticks or other inductive devices, sonde devices, and exciter devices associated with utility frequency identification marker devices.

In another aspect, the disclosure is directed to a signal generation device including an auto-tuning electronic circuit module for generating tuned output signals. The auto-tuning electronic circuit module may include, for example, a tunable resonant electronic circuit element for providing a tuned output signal, including a voltage divider element and a tuning array element and a control element. The control element may include, for example, a sensing element for measuring output signal strength and a processing element for comparing previous output signal strength values stored in a non-transitory memory element to a current signal strength value and providing a corresponding control signal to tune the tunable resonant electronic circuit. The control element may further provide, as an output, an input signal to drive the tunable resonant electronic circuit element.

The signal generation device may further include, for example, an input signal generator circuit for providing an output to a corresponding input of the tunable electronic circuit element, wherein the control element provides, as an output, an input signal to the input signal generator circuit.

The tunable resonant electronic circuit element may include, for example, an inductor and a first capacitor in series driven by an input signal at a resonant frequency, with one lead of the inductor coupled to a ground and one lead of the first capacitor coupled to receive the input signal from the input signal generator circuit output from a first lead, and a second lead of the input signal generator circuit output is coupled to the ground. The voltage divider element may include a capacitive voltage divider circuit coupled between the inductor and first capacitor, comprising a second capacitor dividing against a third capacitor, and a tuning array element including a plurality of switched capacitors and associated switches on a circuit branch tapped from between the first and second capacitors of the capacitive voltage divider, where the plurality of capacitors as switched on or off by the switches have capacitance values to increase or decrease the aggregate capacitance during tuning based on the control signal from the control element. The plurality of switched capacitors may comprise four or more switched capacitors. The plurality of switched capacitors may be arranged in the tuning array element so as to be switched on by the switches based on increasing capacitance value during tuning, and wherein the voltage rating of ones of the switched capacitors progressively decrease in value as the capacitance increases in value to reduce the aggregate switching capacitors' physical size.

Tuning of the tuning array may, for example, begin with all of the switched capacitors switched on. Alternately, tuning of the tuning array begins with all of the switched capacitors switched off. One or more of the plurality of switched capacitors has a value of about one (1) farad (F). The switched capacitors may be arranged in the tuning array in progressively increasing order and may be switched in or out in such order during tuning.

The input signal provided from the control element or signal generation device may, for example, be a square wave signal. Alternately, the input signal provided from the control element or signal generation device may be a sinusoidal or other-shaped waveform.

The control element may, for example, include electronic circuitry having one or more processing elements. The processing elements may be programmed with internal or external instructions stored in a non-transitory memory to implement a control method for auto-tuning in conjunction with the tunable resonant electronic circuit electronics and switching components that includes controlling generation of an input signal to drive the tunable resonant circuit, measuring a first signal strength of an output signal from the tunable resonant circuit and storing the measured first signal strength in a non-transitory memory element, switching one of the switched capacitors, measuring a second, subsequent signal strength of the output signal, comparing the stored first measured output signal strength measurement with the second output signal strength measurement, and switching another of the switched capacitors responsive to the comparison.

The control element may, for example, include electronic circuitry having one or more processing elements. The processing elements may be programmed with internal or external instructions stored in a non-transitory memory to implement a tuning drift measurement and adjustment in conjunction with the tunable resonant electronic circuit electronics and switching components that includes closing one of the switched capacitors, measuring a first signal strength of the tunable resonant circuit, comparing the first signal strength to a previously stored output signal strength value stored in a non-transitory memory, and adjusting, responsive to the comparing, the tuning of the tunable resonant circuit based at least in part on the comparison.

The device may comprise, for example, a dipole magnetic field generating sonde. In this configuration the device may further including a sonde housing, a sonde antenna, and a battery for providing power. The auto-tuning electronic circuit module may be disposed in the sonde housing and the tuned output may be operatively coupled to the sonde antenna.

The device may comprise, for example, a utility locator transmitter. In this configuration the device may further include a utility locator transmitter housing, a utility locator transmitter output connector, and a rechargeable battery for providing power to the transmitter. The auto-tuning electronic circuit module may be disposed in the sonde housing and the output may be operatively coupled to the transmitter output connector.

The device may comprise, for example, an elongate induction stick. In this configuration the device may further include an elongate housing, a coil antenna, and a battery for providing power. The auto-tuning electronic circuit module may be disposed in the elongate induction stick housing and the output may be operatively coupled to the elongate induction stick coil antenna, which may also be disposed in the elongate housing.

In another aspect, the disclosure is directed to an auto-tuning electronic circuit module for generating tuned output signals. The electronic circuit module may include, for example, a tunable resonant electronic circuit element for providing a tuned output signal, including a voltage divider element and a tuning array element and a control element including a sensing element for measuring output signal strength. The electronic circuit module may also include a processing element for comparing previous output signal strength values stored in a non-transitory memory element to a current signal strength value and providing a corresponding control signal to tune the tunable resonant electronic circuit and/or an input signal to drive the tunable resonant electronic circuit element. The tunable resonant circuit element may include an inductor and a first capacitor in series driven by an input signal at a resonant frequency, with one lead of the inductor coupled to a ground and one lead of the first capacitor coupled to receive the input signal from the input signal generator circuit output from a first lead, and wherein a second lead of the input signal generator circuit output is coupled to the ground. The voltage divider element may include a capacitive voltage divider circuit coupled between the inductor and first capacitor, comprising a second capacitor dividing against a third capacitor, and a tuning array element including a plurality of switched capacitors and associated switches on a circuit branch tapped from between the first and second capacitors of the capacitive voltage divider. The plurality of capacitors switched on or off by the switches may have capacitance values to increase or decrease the aggregate capacitance during tuning based on the control signal from the control element. The plurality of switched capacitors may be arranged in the tuning array element so as to be switched on by the switches based on increasing capacitance value during tuning. The voltage rating of ones of the switched capacitors may progressively decrease in value as the capacitance increases in value so as to reduce the aggregate switching capacitors' physical size.

In another aspect, the disclosure is directed to a method for automatically tuning frequency in a utility locating device current signal generator. The method may include, for example, one or more of the steps of providing, from a control element, an input signal to a tunable resonant circuit, measuring a first signal strength of an output signal from the tunable resonant circuit, storing the measured first signal strength in a non-transitory memory element, switching on one switched capacitor of a plurality of switched capacitors in the tunable resonant circuit, measuring a second, subsequent signal strength of the output signal, comparing the stored first measured output signal strength measurement with the second output signal strength measurement, and/or switching another of the switched capacitors responsive to the comparison.

Details of the systems, devices, and methods referred to herein and additional components, methods, and configurations that may be used in conjunction with the embodiments described subsequently herein are disclosed in co-assigned patent applications including: U.S. Pat. No. 7,009,399, issued Mar. 7, 2006, entitled OMNIDIRECTIONAL SONDE AND LINE LOCATOR; U.S. Pat. No. 7,136,765, issued Nov. 14, 2006, entitled A BURIED OBJECT LOCATING AND TRACING METHOD AND SYSTEM EMPLOYING PRINCIPAL COMPONENTS ANALYSIS FOR BLIND SIGNAL DETECTION; U.S. Pat. No. 7,221,136, issued May 22, 2007, entitled SONDES FOR LOCATING UNDERGROUND PIPES AND CONDUITS; U.S. Pat. No. 7,276,910, issued Oct. 2, 2007, entitled COMPACT SELF-TUNED ELECTRICAL RESONATOR FOR BURIED OBJECT LOCATOR APPLICATIONS; U.S. Pat. No. 7,288,929, issued Oct. 30, 2007, entitled INDUCTIVE CLAMP FOR APPLYING SIGNAL TO BURIED UTILITIES; U.S. Pat. No. 7,332,901, issued Feb. 19, 2008, entitled LOCATOR WITH APPARENT DEPTH INDICATION; U.S. Pat. No. 7,336,078, issued Feb. 26, 2008, entitled MULTI-SENSOR MAPPING OMNIDIRECTIONAL SONDE AND LINE LOCATORS; U.S. Pat. No. 7,557,559, issued Jul. 7, 2009, entitled COMPACT LINE ILLUMINATOR FOR LOCATING BURIED PIPES AND CABLES; U.S. Pat. No. 7,619,516, issued Nov. 17, 2009, entitled SINGLE AND MULTI-TRACE OMNIDIRECTIONAL SONDE AND LINE LOCATORS AND TRANSMITTER USED THEREWITH; U.S. Pat. No. 7,733,077, issued Jun.

8, 2010, entitled MULTI-SENSOR MAPPING OMNIDIRECTIONAL SONDE AND LINE LOCATORS AND TRANSMITTER USED THEREWITH; U.S. Pat. No. 7,741,848, issued Jun. 22, 2010, entitled ADAPTIVE MULTICHANNEL LOCATOR SYSTEM FOR MULTIPLE PROXIMITY DETECTION; U.S. Pat. No. 7,755,360, issued Jul. 13, 2010, entitled PORTABLE LOCATOR SYSTEM WITH JAMMING REDUCTION; U.S. Pat. No. 9,625,602, issued Apr. 18, 2017, entitled SMART PERSONAL COMMUNICATION DEVICES AS USER INTERFACES; U.S. Pat. No. 7,830,149, issued Nov. 9, 2010, entitled AN UNDERGROUND UTILITY LOCATOR WITH A TRANSMITTER, A PAIR OF UPWARDLY OPENING POCKETS AND HELICAL COIL TYPE ELECTRICAL CORDS; U.S. Pat. No. 7,969,151, issued Jun. 28, 2011, entitled PRE-AMPLIFIER AND MIXER CIRCUITRY FOR A LOCATOR ANTENNA; U.S. Pat. No. 8,013,610, issued Sep. 6, 2011, entitled HIGH-Q SELF TUNING LOCATING TRANSMITTER; U.S. Pat. No. 8,203,343, issued Jun. 19, 2012, entitled RECONFIGURABLE PORTABLE LOCATOR EMPLOYING MULTIPLE SENSOR ARRAY HAVING FLEXIBLE NESTED ORTHOGONAL ANTENNAS; U.S. Pat. No. 8,248,056, issued Aug. 21, 2012, entitled BURIED OBJECT LOCATOR SYSTEM EMPLOYING AUTOMATED VIRTUAL DEPTH EVENT DETECTION AND SIGNALING; U.S. Pat. No. 9,599,499, issued Mar. 21, 2017, entitled SYSTEMS AND METHODS FOR LOCATING BURIED OR HIDDEN OBJECTS USING SHEET CURRENT FLOW MODELS; U.S. Pat. No. 8,264,226, issued Sep. 11, 2012, entitled SYSTEM AND METHOD FOR LOCATING BURIED PIPES AND CABLES WITH A MAN PORTABLE LOCATOR AND A TRANSMITTER IN A MESH NETWORK; U.S. Pat. No. 9,638,824, issued May 2, 2017, entitled QUAD-GRADIENT COILS FOR USE IN LOCATING SYSTEMS; U.S. patent application Ser. No. 13/769,202, filed Feb. 15, 2013, entitled SMART PAINT STICK DEVICES AND METHODS; U.S. patent application Ser. No. 13/787,711, filed Mar. 6, 2013, entitled DUAL SENSED LOCATING SYSTEMS AND METHODS; U.S. Pat. No. 8,400,154, issued Mar. 19, 2013, entitled LOCATOR ANTENNA WITH CONDUCTIVE BOBBIN; U.S. patent application Ser. No. 14/027,027, filed Sep. 13, 2013, entitled SONDE DEVICES INCLUDING A SECTIONAL FERRITE CORE STRUCTURE; U.S. patent application Ser. No. 14/077,022, filed Nov. 11, 2013, entitled WEARABLE MAGNETIC FIELD UTILITY LOCATOR SYSTEM WITH SOUND FIELD GENERATION; U.S. Pat. No. 8,547,428, issued Oct. 1, 2013, entitled PIPE MAPPING SYSTEM; U.S. Pat. No. 8,635,043, issued Jan. 21, 2014, entitled Locator and Transmitter Calibration System; U.S. Pat. No. 9,632,199, issued Apr. 25, 2017, entitled INDUCTIVE CLAMP DEVICES, SYSTEMS, AND METHODS; U.S. Pat. No. 9,057,754, issued Jun. 16, 2015, entitled ECONOMICAL MAGNETIC LOCATOR APPARATUS AND METHOD; U.S. Pat. No. 9,081,109, issued Jul. 14, 2015, entitled GROUND-TRACKING DEVICES FOR USE WITH A MAPPING LOCATOR; U.S. Pat. No. 9,082,269, issued Jul. 14, 2015, entitled HAPTIC DIRECTIONAL FEEDBACK HANDLES FOR LOCATION DEVICES; U.S. Pat. No. 9,085,007, issued Jul. 21, 2015, entitled MARKING PAINT APPLICATOR FOR PORTABLE LOCATOR; U.S. Pat. No. 9,341,740, issued May 17, 2016, entitled OPTICAL GROUND TRACKING APPARATUS, SYSTEMS, AND METHODS; U.S. Pat. No. 9,411,067, issued Aug. 9, 2016, entitled GROUND-TRACKING SYSTEMS AND APPARATUS; U.S. patent application Ser. No. 15/247,503, filed Aug. 25, 2016, entitled LOCATING DEVICES, SYSTEMS, AND METHODS USING FREQUENCY SUITES FOR UTILITY DETECTION; U.S. Pat. No. 9,435,907, issued Sep. 6, 2016, entitled PHASE SYNCHRONIZED BURIED OBJECT LOCATOR APPARATUS, SYSTEMS, AND METHODS; U.S. Pat. No. 9,465,129, issued Oct. 11, 2016, entitled IMAGE-BASED MAPPING LOCATING SYSTEM; U.S. patent application Ser. No. 15/345,421, filed Nov. 7, 2016, entitled OMNI-INDUCER TRANSMITTING DEVICES AND METHODS; U.S. Pat. No. 9,488,747, issued Nov. 8, 2016, entitled DUAL ANTENNA SYSTEMS WITH VARIABLE POLARIZATION; U.S. patent application Ser. No. 15/360,979, filed Nov. 23, 2016, entitled UTILITY LOCATING SYSTEMS, DEVICES, AND METHODS USING RADIO BROADCAST SIGNALS; U.S. patent application Ser. No. 15/457,149, filed Mar. 13, 2017, entitled USER INTERFACES FOR UTILITY LOCATOR; U.S. patent application Ser. No. 15/457,222, filed Mar. 13, 2017, entitled SYSTEMS AND METHODS FOR LOCATING BURIED OR HIDDEN OBJECTS USING SHEET CURRENT FLOW MODELS; U.S. Pat. No. 9,599,740, issued Mar. 21, 2017, entitled USER INTERFACES FOR UTILITY LOCATORS; U.S. patent application Ser. No. 15/470,642, filed Mar. 27, 2017, entitled UTILITY LOCATING APPARATUS AND SYSTEMS USING MULTIPLE ANTENNA COILS; U.S. patent application Ser. No. 15/470,713, filed Mar. 27, 2017, entitled UTILITY LOCATORS WITH PERSONAL COMMUNICATION DEVICE USER INTERFACES; U.S. patent application Ser. No. 15/483,924, filed Apr. 10, 2017, entitled SYSTEMS AND METHODS FOR DATA TRANSFER USING SELF-SYNCHRONIZING QUADRATURE AMPLITUDE MODULATION (QAM); U.S. patent application Ser. No. 15/485,082, filed Apr. 11, 2017, entitled MAGNETIC UTILITY LOCATOR DEVICES AND METHODS; U.S. patent application Ser. No. 15/485,125, filed Apr. 11, 2017, entitled INDUCTIVE CLAMP DEVICES, SYSTEMS, AND METHODS; U.S. patent application Ser. No. 15/490,740, filed Apr. 18, 2017, entitled NULLED-SIGNAL UTILITY LOCATING DEVICES, SYSTEMS, AND METHODS; U.S. patent application Ser. No. 15/497,040, filed Apr. 25, 2017, entitled SYSTEMS AND METHODS FOR LOCATING AND/OR MAPPING BURIED UTILITIES USING VEHICLE-MOUNTED LOCATING DEVICES; U.S. patent application Ser. No. 15/590,964, filed May 9, 2017, entitled BORING INSPECTION SYSTEMS AND METHODS; U.S. patent application Ser. No. 15/623,174, filed Jun. 14, 2017, entitled TRACKABLE DIPOLE DEVICES, METHODS, AND SYSTEMS FOR USE WITH MARKING PAINT STICKS; U.S. patent application Ser. No. 15/626,399, filed Jun. 19, 2017, entitled SYSTEMS AND METHODS FOR UNIQUELY IDENTIFYING BURIED UTILITIES IN A MULTI-UTILITY ENVIRONMENT; U.S. Pat. No. 9,684,090, issued Jun. 20, 2017, entitled NULLED-SIGNAL LOCATING DEVICES, SYSTEMS, AND METHODS; U.S. patent application Ser. No. 15/633,682, filed Jun. 26, 2017, entitled BURIED OBJECT LOCATING DEVICES AND METHODS; U.S. Pat. No. 9,696,448, filed Jul. 4, 2017, entitled GROUND-TRACKING DEVICES AND METHODS FOR USE WITH A UTILITY LOCATOR; U.S. patent application Ser. No. 15/681,409, filed Aug. 20, 2017, entitled WIRELESS BURIED PIPE AND CABLE LOCATING SYSTEMS; U.S. Pat. No. 9,746,572, issued Aug. 29, 2017, entitled ELECTRONIC MARKER DEVICES AND SYSTEMS; U.S. Pat. No. 9,784,837, issued Oct. 10, 2017, entitled OPTICAL ROUND TRACKING APPARATUS, SYSTEMS AND METHODS; U.S. Pat. No. 9,798,033, issued Oct. 24, 2017, entitled SONDE DEVICES INCLUDING A SECTIONAL FERRITE CORE; U.S. patent application Ser. No. 15/811,361, filed Nov. 13, 2017, entitled OPTICAL GROUND TRACKING APPARATUS, SYSTEMS, AND METHODS; U.S. Pat. No. 9,841,503, issued Dec. 12, 2017, entitled OPTICAL GROUND TRACKING APPARATUS, SYSTEMS, AND METHODS; U.S. patent application Ser. No. 15/846,102, filed Dec. 18, 2017, entitled SYSTEMS AND METHODS FOR ELECTRONICALLY MARKING, LOCATING AND VIRTUALLY DISPLAYING BURIED UTILITIES; U.S. patent application Ser. No. 15/866,360, filed Jan. 9, 2018, entitled TRACKED DISTANCE MEASURING DEVICES, SYSTEMS, AND METHODS; U.S. Pat. No. 9,880,309, issued Jan. 30, 2018, entitled UTILITY LOCATOR TRANSMITTER APPARATUS AND METHODS; #U.S. patent application Ser. No. 15/889,067, filed Feb. 5, 2018, entitled UTILITY LOCATOR TRANSMITTER DEVICES, SYSTEMS, AND METHODS WITH DOCK ABLE APPARATUS; U.S. Pat. No. 9,891,337, issued Feb. 13, 2018, entitled UTILITY LOCATOR TRANSMITTER DEVICES, SYSTEMS, AND METHODS WITH DOCKABLE APPARTUS; U.S. Pat. No. 9,927,545, issued Mar. 27, 2018, entitled MULTI-FREQUENCY LOCATING SYSTEMS AND METHODS; U.S. Pat. No. 9,927,546, filed Mar. 27, 2018, entitled PHASE-SYNCHRONIZED BURIED OBJECT TRANSMITTER AND LOCATOR METHODS AND APPARATUS; U.S. Pat. No. 9,928,613, issued Mar. 27, 2018, entitled GROUND TRACKING APPARATUS, SYSTEMS, AND METHODS; U.S. Pat. No. 9,959,641, issued May 1, 2018, entitled METHODS AND SYSTEMS FOR SEAMLESS TRANSITIONING IN INTERACTIVE MAPPING SYSTEMS; U.S. Pat. No. 10,027,526, issued Jul. 17, 2018, entitled METHODS AND APPARATUS FOR HIGH-SPEED DATA TRANSFER EMPLOYING SELF-SYNCHRONIZING QUADRATURE AMPLITUDE MODULATION (QAM); U.S. Pat. No. 10,031,253, issued Jul. 24, 2018, entitled GRADIENT ANTENNA COILS AND ARRAYS FOR USE IN LOCATING SYSTEMS; U.S. Pat. No. 10,042,072, issued Aug. 7, 2018, entitled OMNI-INDUCER TRANSMITTING DEVICES AND METHODS; U.S. Pat. No. 10,059,504, issued Aug. 28, 2018, entitled MARKING PAINT APPLICATOR FOR USE WITH PORTABLE UTILITY LOCATOR; U.S. Pat. No. 10,073,186, issued Sep. 11, 2018, entitled KEYED CURRENT SIGNAL UTILITY LOCATING SYSTEMS AND METHODS; U.S. Pat. No. 10,078,149, issued Sep. 18, 2018, entitled BURIED OBJECT LOCATOR APPARATUS AND SYSTEMS; U.S. Pat. No. 10,082,599, issued Sep. 25, 2018, entitled MAGNETIC SENSING BURIED OBJECT LOCATOR INCLUDING A CAMERA; U.S. patent application Ser. No. 16/144,878, filed Sep. 27, 2018, entitled MULTIFUNCTION BURIED UTILITY LOCATING CLIPS; U.S. patent application Ser. No. 16/178,494, filed Nov. 1, 2018, entitled THREE-AXIS MEASUREMENT MODULES AND SENSING METHODS; U.S. Pat. No. 10,162,074, issued Dec. 25, 2018, entitled UTILITY LOCATORS WITH RETRACTABLE SUPPORT STRUCTURES AND APPLICATIONS THEREOF; U.S. patent Ser. No. 16/449,187, filed Jun. 21, 2019, entitled ACTIVE MARKER DEVICES FOR UNDERGROUND USE; U.S. Pat. No. 10,247,845, issued Apr. 2, 2019, entitled UTILITY LOCATOR TRANSMITTER APPARATUS AND METHODS; U.S. Utility patent application Ser. No. 16/382,136, filed Apr. 11, 2019, entitled GEOGRAPHIC MAP UPDATING METHODS AND SYSTEMS; U.S. Pat. No. 10,274,632, issued Apr. 30, 2019, entitled UTILITY LOCATING SYSTEMS WITH MOBILE BASE STATION; U.S. Provisional Patent Application 62/870,443, filed Jul. 3, 2019, entitled AUTOTUNING MODULES; U.S. Pat. No. 10,353,103, filed Jul. 16, 2019, entitled SELF-STANDING MULTI-LEG ATTACHMENT DEVICES FOR USE WITH UTILITY LOCATORS; U.S. Pat. No. 10,371,305, issued Aug. 6, 2019, entitled DOCKABLE TRIPODAL CAMERA CONTROL UNIT; U.S. Pat. No. 10,401,526, issued Sep. 3, 2019, entitled BURIED UTILTY MARKER DEVICES, SYSTEMS, AND METHODS; U.S. Provisional Patent Application 62/899,296, filed Sep. 12, 2019, entitled ANTENNA SYSTEMS FOR CIRCULARLY POLARIZED RADIO SIGNALS; U.S. patent application Ser. No. 16/701,085, filed Dec. 2, 2019, entitled MAP GENERATION BASED ON UTILITY LINE POSITION AND ORIENTATION ESTIMATES; U.S. Pat. No. 10,534,105, issued Jan. 14, 2020, entitled UTILITY LOCATING TRANSMITTER APPARATUS AND METHODS; U.S. patent application Ser. No. 16/255,524, filed Jan. 23, 2019, entitled RECHARGEABLE BATTERY PACK ONBOARD CHARGE STATE INDICATION METHODS AND APPARATUS; U.S. Pat. No. 10,555,086, issued Feb. 4, 2020, entitled MAGNETIC FIELD CANCELING AUDIO SPEAKERS FOR USE WITH BURIED UTILITY LOCATORS OR OTHER DEVICES. The content of each of the above-described patents and applications is incorporated by reference herein in its entirety. The above-described patent applications and patents may be referred to herein collectively as the "co-assigned applications" or "incorporated applications."

The following exemplary embodiments are provided for the purpose of illustrating examples of various aspects, details, and functions of the present disclosure; however, the described embodiments are not intended to be in any way limiting. It will be apparent to one of ordinary skill in the art that various aspects may be implemented in other embodiments within the spirit and scope of the present disclosure. As used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Various additional aspects, features, devices, systems, and functionality are further described below in conjunction with the appended Drawings.

Example Auto-Tuning Modules

An example buried utility locating system 100 is illustrated in FIG. 1. This locating system may include one or more auto-tuning modules in accordance with aspects of the present disclosure for generating a tuned output signal.

The utility locating system 100 may include one or more utility position and orientation estimating devices such as the hand-carried magnetic field sensing buried utility locating device (also denoted herein as a "locator" for brevity) 110. Locator 110 may be used to determine and optionally map, via detection and processing of alternating current (AC) magnetic field signals, the location of hidden or buried utility lines or other conductors, such as utility lines 115 and 120, which may be buried beneath the ground's surface. For example, some utility lines, such as utility line 115, may have current coupled or induced onto it, using more transmitter devices and associated direct coupling or inductive apparatus, or via stand-alone inductive devices which inductively induce current via AC electromagnetic fields, such as transmitter 125 with inductive clamp 150 or stand-alone inductive device 130, which may be an induction stick as disclosed in the incorporated applications. Transmitter 125 may also include an internal inductive device, rather than an operatively coupled inductive apparatus, for coupling current signals onto a utility such as utility lines 115 or 120. It is noted that a transmitter as described herein is not a conventional radio transmitter but rather, as known in the field of locating, a current generating device for generating one or more output current signals at one or more frequencies via an output connector. Direct contact current clamps may be attached to the transmitter output connector via conductive cables to directly couple the current through physical contact with the utility. Inductive clamps may alternately be used to couple current signals, typically at higher AC frequencies, to the utility without direct physical contact. An induction stick is a similar elongate hand held device that generates and radiates magnetic fields signals for inductive coupling the utility (e.g., as shown as inductive device 130 in FIG. 1).

Once current is coupled to the utility either directly or inductively (or when current flow inherently in the line such as with AC power lines or other powered conductors), the magnetic field of current in utility line 115 may be measured by the locator 110 to determine the utility line's position and orientation in the ground relative to the user and locator. If the locator includes or is operatively coupled to a position sensing module or device, such as a GPS or other satellite or terrestrial locating system receiver or transceiver, absolute position of the utility may also be determined by relating the relative position to the locator with the locator's absolute position information determined in the position sensing module.

In various embodiments, utility locator transmitter devices and inductive devices, such as transmitter 125 with inductive clamp 150 and inductive device 130, which may be an induction stick as described in may include one or more auto-tuning modules in accordance with aspects of the present disclosure for generating a signal at a tuned frequency that may then be coupled a utility line or other conductor, such as utility line 115. The transmitter 125 with inductive clamp 150 and inductive device 130 may, in exemplary embodiments, be of the type disclosed in U.S. Pat. No. 7,276,910, issued Oct. 2, 2007, entitled A COMPACT SELF-TUNED ELECTRICAL RESONATOR FOR BURIED OBJECT LOCATOR APPLICATION and U.S. Pat. No. 9,632,199, issued Apr. 25, 2017, entitled INDUCTIVE CLAMP DEVICES, SYSTEMS, AND METHODS, or, in other embodiments, may be of the type disclosed elsewhere in the incorporated applications.

Still referring to FIG. 1, other locating system devices may include auto-tuning modules in accordance with aspects of the present disclosure for generating tuned output signals. For example, system 100 may include a magnetic field dipole AC signal generating sonde (also denoted here as a "sonde" for brevity) 135 inserted in utility line 120 to generate and broadcast a tuned AC dipole magnetic field output signal that may be measured at locator(s) help by the user above the ground's surface to determine the position and orientation of sonde 135 and thereby the point in the utility line 120 where the sonde is inserted to. The sonde may include one or more auto-tuning modules in accordance with aspects of the present disclosure to generate signals at the desired tuned frequencies. The sonde 135 may, for example, be of the type disclosed in U.S. Pat. No. 9,798,033, issued Oct. 24, 2017, entitled SONDE DEVICES INCLUDING A SECTIONAL FERRITE CORE.

The system 100 may also include a transceiver or exciter device 140, illustrated in FIG. 1 as coupled to utility locating device 110, to generate a signal to "ping" marker device 145 (i.e., a radiofrequency signal at a predefined frequency received by the marker device and scavenged for power therein) which may, as a result, generate an associated response signal for identifying the location of the marker device 145 and thereby associated utility line 120. The exciter device 140 may include one or more auto-tuning modules in accordance with aspects of the present disclosure to generate output signals at a tuned frequency to ping the marker device 145. The marker device 145 and exciter device 140 (also referred to as a transceiver device) may, for example, be of the type disclosed in U.S. Pat. No. 9,746,572, issued Aug. 29, 2017, entitled ELECTRONIC MARKER DEVICES AND SYSTEMS of the incorporated applications or may be other RFID-type devices as known or developed in the art.

In operation, utility locating system devices for signal generation may experience a variety of conditions that interfere with the tuning of the output signal. For example, tuning drift may occur due to temperature variation, degradation of components over time, and/or local environment conditions. Local environmental conditions may, for example, include those related to the device being buried beneath the ground's surface such as position, soil conditions, moisture present in the surrounding environment, the presence of conductive objects which may interfere with the tuning of the output signal, and/or other conditions of the environment that may negatively impact tuning. The auto-tuning modules and methods herein may be used to advantageously compensate for such conditions.

Figure 5A:
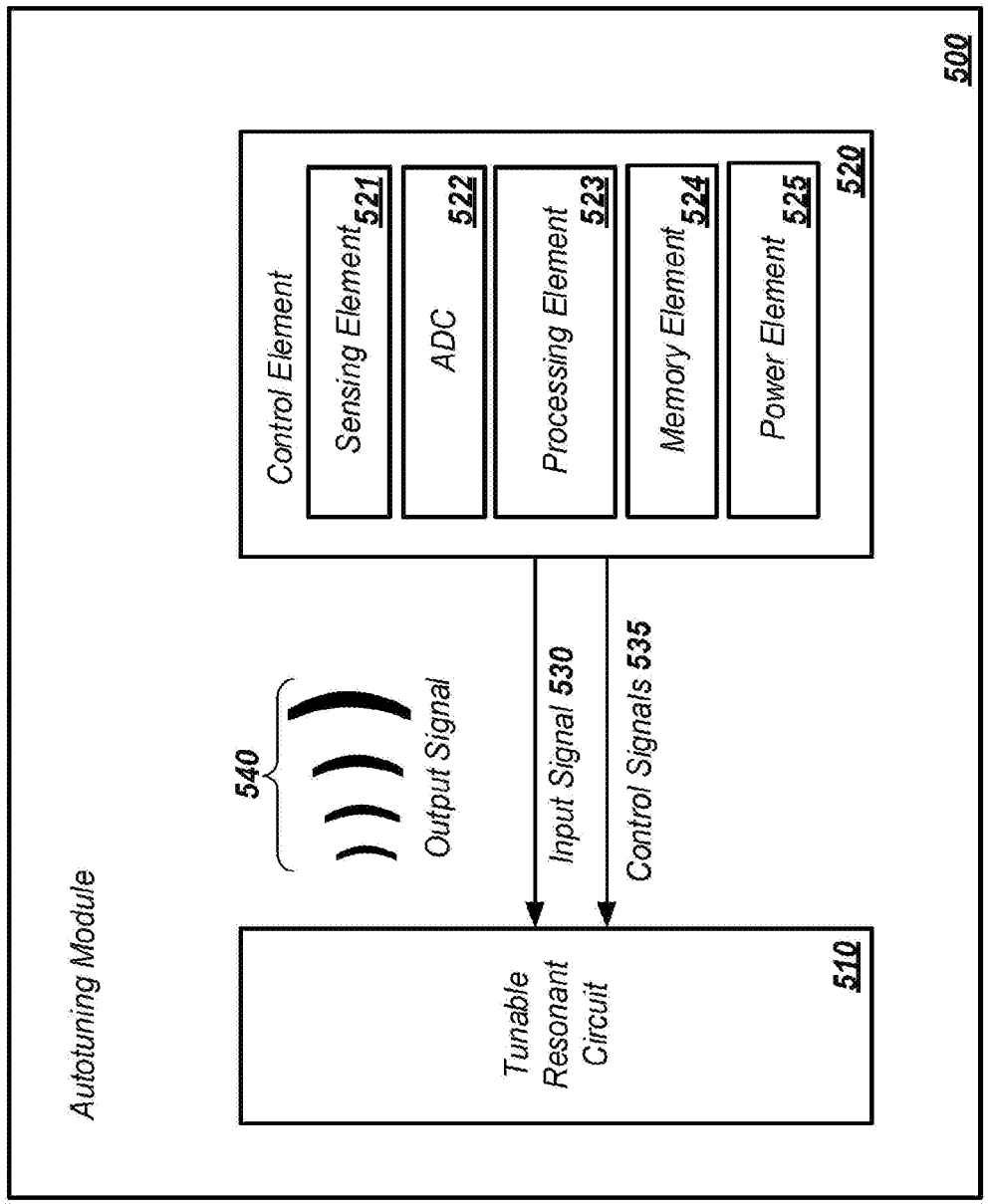
FIG. 5A is a diagram of an auto-tuning module embodiment in accordance with aspects of the present disclosure.

Various embodiments of auto-tuning modules based on the disclosures herein, such as auto-tuning module 500 of FIG. 5A, may be used in other utility locating system devices for generating tuned signals. Likewise, the various auto-tuning modules disclosed herein may also be used in various other applications for generating a tuned signal that are not necessarily related to locator systems. Such auto-tuning modules may utilize a tunable resonant circuit topology.

Figure 2:
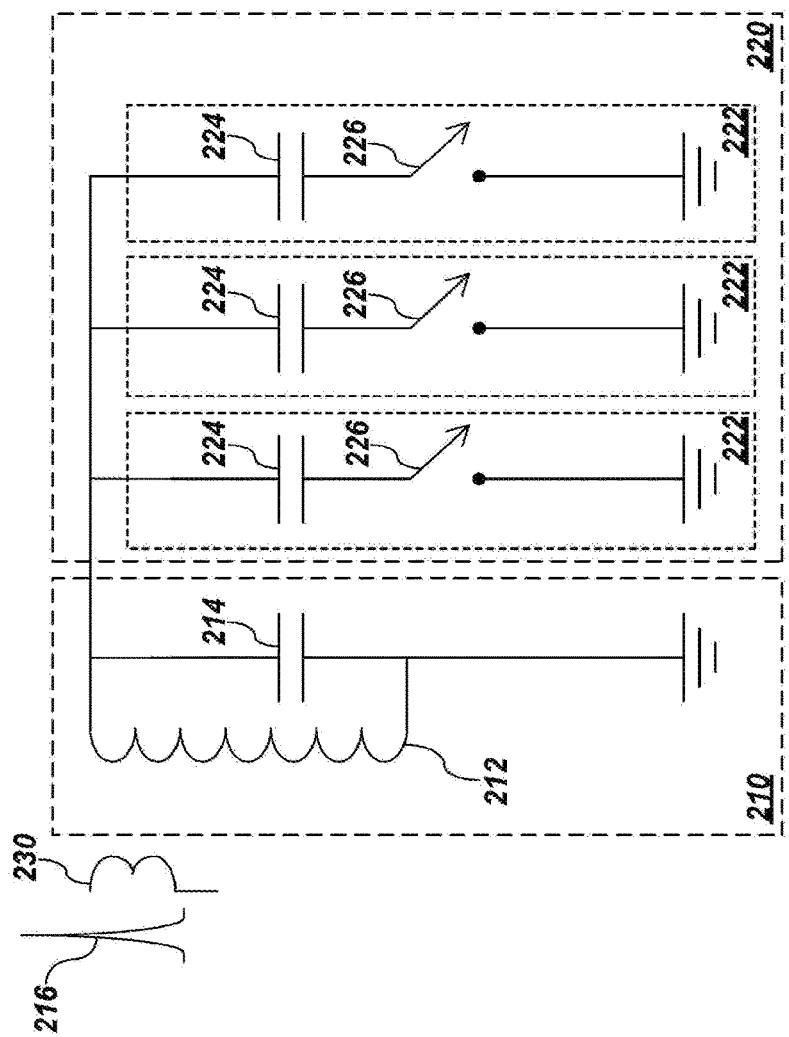
FIG. 2 illustrates an example prior art tunable resonant circuit.

FIG. 2 is a prior art example of a tunable resonant circuit 200. The circuit 200 includes a resonant circuit element 210 and a tuning array 220. The resonant circuit element 210 may have an inductor 212 and capacitor 214 is series. In circuit 200, the inductor 212 of the resonant circuit element 210 may receive a pulse input signal 216 from a low impedance excitation coil 230 to create a signal at a particular frequency. The resonant circuit element 210 may resonate at the frequency of the input signal 216 until the excitation coil 230 ceases to generate input signal 216. Upon cessation, the resonant circuit element 210 may decay at its tuned frequency.

In some cases, the frequency of the resonant circuit element 210 may be imperfectly tuned, thus requiring the tuning array 220 to compensate for such inaccuracies. The tuning array 220 may adjust by including an array of individual tuning elements 222 in parallel, tapped from the resonant circuit element 210. Each tuning element 222 may include a tuning capacitor 224 and a switch 226, which may be field-effect transistors (FET). As tuned high Q circuits can generate high voltages and/or currents, due to the topography of circuit 200, all tuning capacitors 224 and switches 226 of each tuning element 222 must be rated for equally high voltage and high current levels. In an exemplary embodiment, circuit 200 may have a 15 watt input signal resulting in 500 volt 20 amp output, requiring 1,000 volt 20 amp tuning element 222 components. These high voltage and high current components are costly, adding to the overall expense of the circuit 200, as well as being physically large, adding to the overall size of the circuit 200. Furthermore, these circuits may be limited in output due to the lack of components above a threshold maximum voltage rating (e.g., rated over 1,000 volts), and may be limited in tuning ability as each tuning element 222 adds to the loss of circuit 200 thus limiting the quantity of tuning elements.

The prior art circuit 200 also has several other disadvantages. For example, the transformer arrangement between the excitation coil 230 at inductor 212 inherently and undesirably lowers the Q factor of the resonant circuit element 210. Further, the impulse signal at the excitation coil 230 is inefficient, as output power occurs solely at the peak of the pulse input signal 216, wasting all energy along the rise and fall times of the input signal 216. Unlike the auto-tuning module embodiments disclosed herein, the tunable resonant circuit 200 may need to be manually tuned by a user by adjusting the tuning capacitors 224, thereby potentially leading to human error that results in improper or inaccurately tuned output signals.

Figure 3:
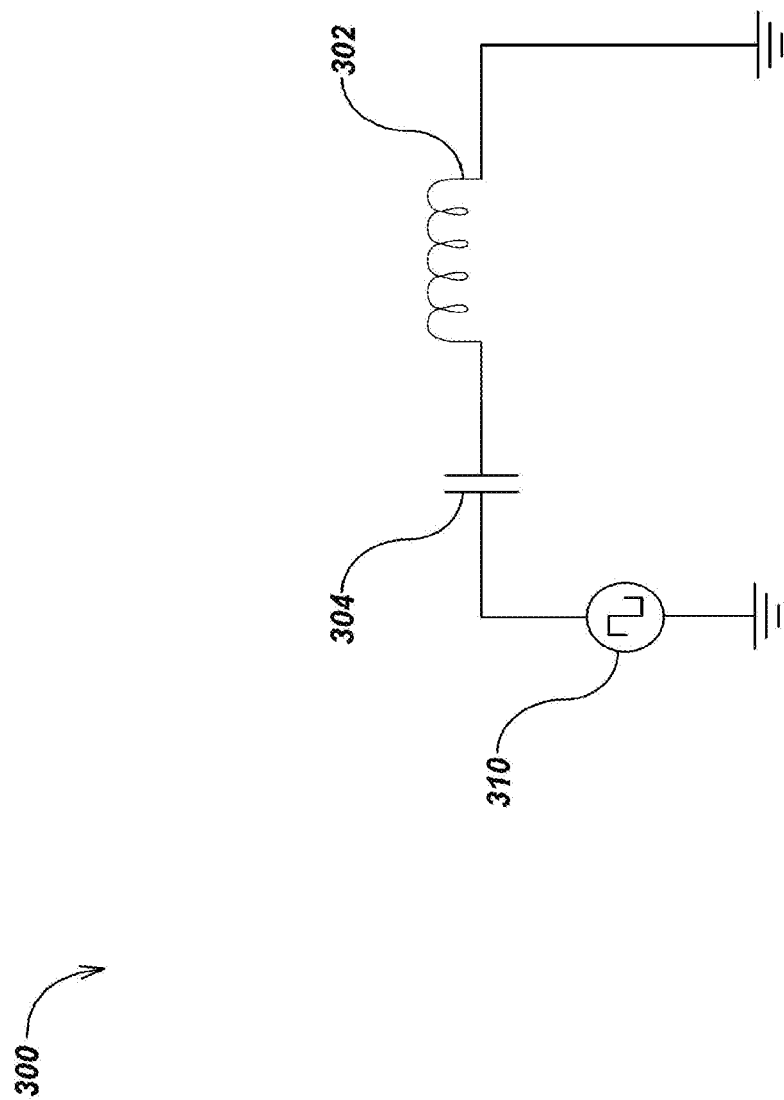
FIG. 3 illustrates an example prior tuned resonant circuit.

FIG. 3 illustrates another prior art tuned resonate circuit 300 that may be used to generate a tuned output signal. Circuit 300 may include an inductor 302 and capacitor 304 in an open circuit topography, with the circuit 300 driven by an input signal 310 that is a square wave at the resonant frequency. The circuit 300 can provide improved efficiency over circuit 200 of FIG. 2, as all energy is in the square wave 310 is at the resonant frequency. Likewise, fewer components are required resulting in a more cost efficient and physically smaller circuit. However, circuit 300 fails in tuning range beyond the predetermined tuning of the inductor 302 and capacitor 304 along with the tuning of the input signal 310. Moreover, in many applications, the circuit 300 may be particularly lossy as high current input is required to generate the desired output signal. Furthermore, such a topology may decay at the inherent tuning of the inductor and capacitor such that any imperfections in these components may lead to inaccurate or improper tuning of output signals.

Figure 4:
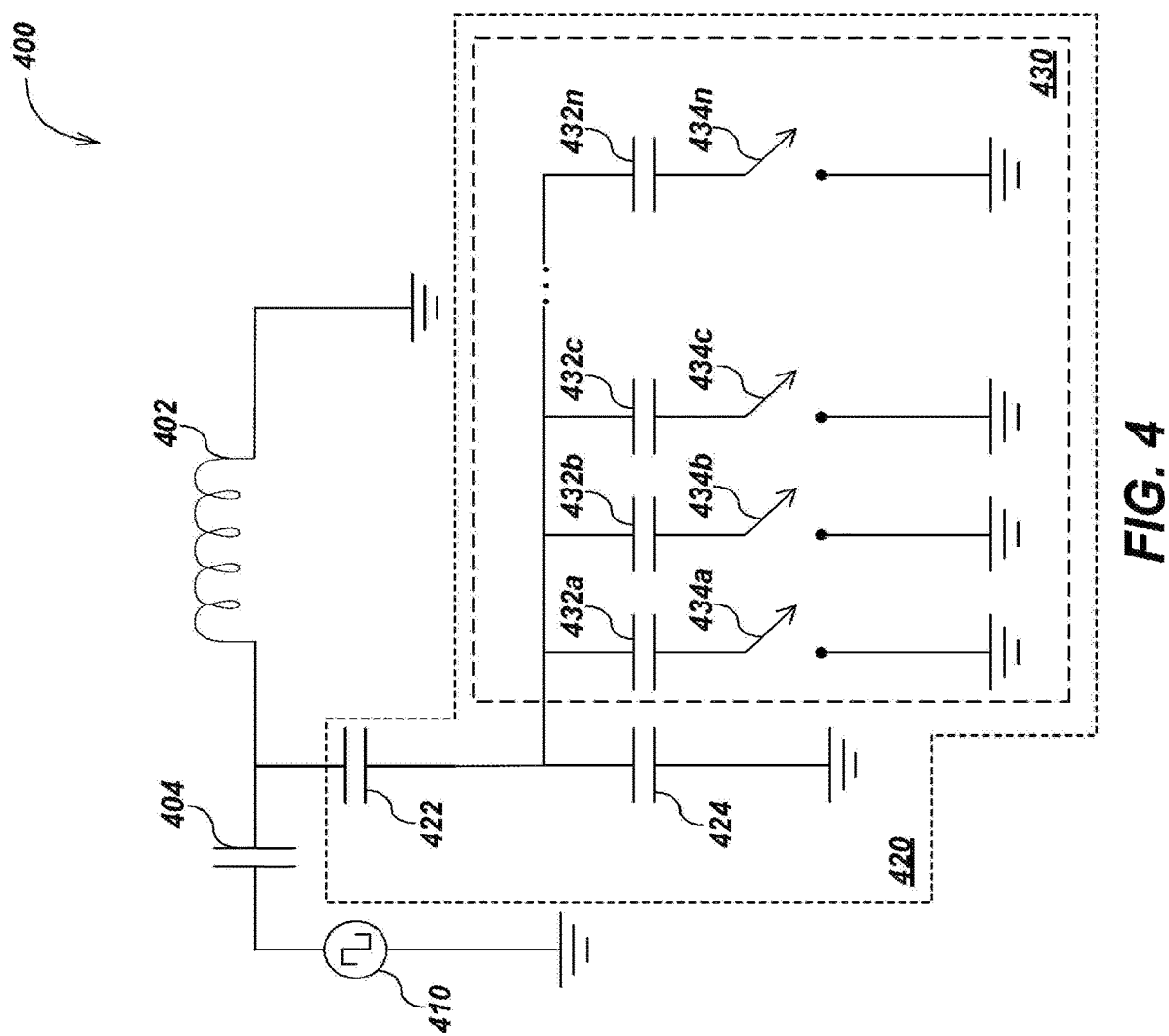
FIG. 4 illustrates details of one embodiment of a tunable resonant circuit which may be used in an auto-tuning module in accordance with aspects of the disclosure.

As shown in FIG. 4, an auto-tuning module in accordance with aspects of the present disclosure may include a tunable resonant electronic circuit element, such the tunable resonant circuit element 400 of FIG. 4. The tunable resonant electronic circuit element 400 may include an inductor 402 and a first tuning capacitor 404 in a series circuit topography with one lead of the inductor coupled to ground, wherein the circuit element 400 may be driven by an input signal generator 410 output. The input signal generator output may be, but is not limited to, a square wave output. On a branch tapped between the first tuning capacitor 404 and inductor 402, the circuit 400 may include a capacitive voltage divider element 420 which may include a second tuning capacitor 422 dividing against a third capacitor 424 and an array of switched capacitors (e.g., capacitors 432a-432n) in a tuning array element 430.

The tuning array element 430 may include a series of tuning capacitors 432a-432n each mated with a switch 434a-434n. The capacitors 432a-432n in the tuning array element 430 may have a range of different capacitance values wherein the capacitors 432a-432n may be actuated (e.g., by closing the associated switches 434a-434n) in increasingly large capacitance value order during tuning of circuit 400. Such a tuning arrangement may allow for lower possible voltage at the later actuated, large capacitance value capacitors than the earlier actuated, smaller capacitance value capacitors. As such, the capacitors in the tuning array element (e.g., capacitors 432a-432n in tuning array element 430) may advantageously be rated for progressively lower and lower voltage as the order in which they are actuated, further allowing for such components to be of lower cost with a smaller physical package size (e.g., the voltage rating of successive switched capacitors decreases as their capacitance value increases).

It should be noted that in various embodiments of tunable resonant circuit elements in accordance with the present disclosure, such as the tunable resonant circuit element 400, the effective capacitance and thereby resonant frequency of the circuit may be affected by the number of capacitors actuated in the tuning array element (e.g., capacitors 432a-434n in tuning array element 430) in combination with the capacitance values of other tuning capacitors in the circuit (e.g., capacitor 404 and capacitor 422). It should also be noted that tuning may begin with either all switches in the tuning array element opened (e.g., such as described with method 600 of FIG. 6A) or with all switches in the tuning array element closed and tuning may occur through opening switches. Alternative embodiments may include circuit topographies having any different numbers of capacitors both in and out of the tuning array element having various capacitance values.

In an exemplary circuit embodiment, the first tuning capacitor 404, the second tuning capacitor 422, and capacitor 424 may, for example, have a capacitance value of 1 F. Assuming that the capacitors 432a-432n in tuning array element 430 are not actuated (e.g., switches 434a-434n are opened), the circuit element 400 may have an effective capacitance value of 1.5 F. Assume 10 volts at the junction of inductor 402 and capacitors 402 and 422. Due to the capacitive voltage divider element 420, 5 volts would appear at capacitors 422 and 424. As further capacitors are actuated in the circuit (e.g., capacitors 432a-432n in tuning array element 430), the voltage present may further be reduced. For instance, the first actuated capacitor in the tuning array element 430 may, for example, be capacitor 432a which may, for example, have a capacitance value of 0.1 F. Wherein capacitor 432a is actuated (e.g., the switch 434a associated with capacitor 432a is closed) and all other switches 434b-434n in the tuning array element 430 are open, the circuit element 400 may have an effective capacitance value of approximately 1.524 F. Given 10 volts at the junction of inductor 402 and capacitors 402 and 422, the maximum voltage at capacitor 432a may be approximately 4.762 volts. Further in this example, the second actuated capacitor in the tuning array element 430 may, for example, be capacitor 432b which may, for example, have a capacitance value of 0.2 F. Wherein capacitors 432a and 432b are actuated (e.g., associated switches 434a and 434b are closed) and all other switches 434c-434n in the tuning array element 430 are open, the circuit element 400 may have an effective capacitance value of approximately 1.565 F. Given 10 volts at the junction of inductor 402 and capacitors 402 and 422, the maximum voltage at capacitor 432b may be approximately 4.348 volts. Further still in this example, the third actuated capacitor in the tuning array element 430 may, for example, be capacitor 432c which may, for example, have a capacitance value of 0.3 F. Wherein capacitors 432a-432c are actuated (e.g., associated switches 434a-434c are closed) and other switches in the tuning array element 430, such as switch 434n, are open, the circuit element 400 may have an effective capacitance value of 1.600 F. Given 10 volts at the junction of inductor 402 and capacitors 402 and 422, the maximum voltage at capacitor 432c may be 4 volts. Finally in this example, the fifth actuated capacitor in the tuning array element 430 may, for example, be capacitor 432n which may, for example, have a capacitance value of 0.5 F. Wherein all capacitors 432a-432n are actuated (e.g., all associated switches 434a-434n are closed), the circuit element 400 may have an effective capacitance value of 1.677 F. Given 10 volts at the junction of inductor 402 and capacitors 402 and 422, the maximum voltage at capacitor 432n may be 3.226 volts.

It should be noted that in some circuit embodiments in accordance with aspects of the present disclosure, an auto-tuning circuit may have multiple combinations of voltage divisions. Likewise, in some embodiments, the tuning elements may instead be inductors rather than the capacitors, using a topography such as that illustrated in the tunable resonant circuit element 400 of FIG. 4. It should further be noted that this configuration may also be applied to a parallel tuned circuit as well as a series tuned circuit by appropriately tapping one of the tuning array elements.

The opening and closing of switches in the tuning array of an auto-tuning module in may be controlled by a control element based on a provided control signal or signals, where the control element may include a sensing element and processing element to evaluate the output signal of the auto-tuning module and make control signals to effect adjustments.

Turning to FIG. 5A, a diagram of an auto-tuning module embodiment 500 in accordance with aspects of the present disclosure is illustrated. Module 500 may include a tunable resonant circuit 510 which may be the same as or similar to or share functional aspects with the tunable resonant circuit element 400 of FIG. 4, tunable resonant circuit 700 of FIG. 7, and/or tunable resonant circuit 800 of FIG. 8. The auto-tuning module 500 may further include a control element 520.

The control element 520 may comprise electronic circuitry to provide one or more input signals 530 and control signals 535 to the tunable resonant circuit 510. The input signal 530 may drive the tunable resonant circuit 510 to generate an output signal 540. The control element 520 may further measure the signal strength of output signal 540 and compare the signal strength of the output signal 540 to prior measurements. A control signal 535 may be generated relating to the comparison of signal strength measurements controlling the opening/closing of switches in the tuning array element of the tunable resonant circuit 510 which may use method 600 of FIG. 6A to optimize the signal strength of the output signal 540.

The control element 520 may include a sensing element 521 for measuring the signal strength of the output signal 540. The sensing element 521 may further couple to an analog-to-digital converter (ADC) 522 to convert the analog output signals 540 to digital input. The control element 520 may further include a processing element 523 for comparing the output signals to those stored in a non-transitory memory element 524 and generating associated control signals 535. In some embodiments, such as with auto-tuning module 500, the control element 520 may further include a power element 525 to provide power to the auto-tuning module 500. In other embodiments, such a power element may be located externally to the auto-tuning module 500. For instance, power may be provided by a power element disposed in the device including an auto-tuning module in keeping with the present disclosure such as the signal generation device 550 of FIG. 5B. Likewise, the processing element 523, memory element 524, and/or other control element 520 components may be located externally to the auto-tuning module 500.

Figure 5B:
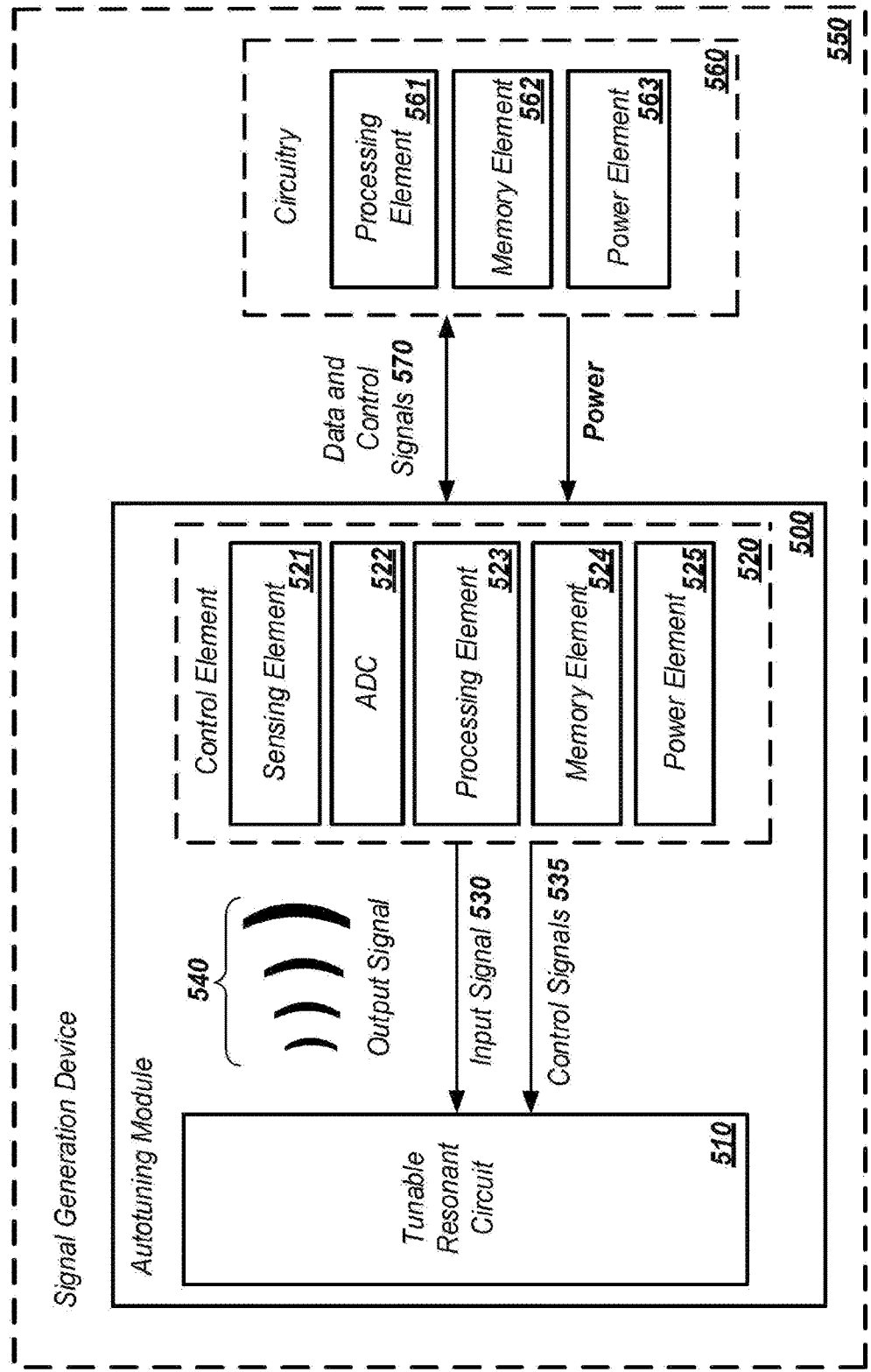
FIG. 5B is a diagram of a signal generating device embodiment including an auto-tuning module in accordance with certain aspects of the present invention.

In FIG. 5B, an auto-tuning module in keeping with the present disclosure, such as auto-tuning module 500, may be disposed in a device configured to broadcast a signal at a tuned frequency such as the signal generation device 550. The signal generation device 550 may be, for instance, a utility locating system device such as the transmitter 125, inductive device 130, sonde 135, and/or exciter device 140 of FIG. 1. The signal generation device 550 may further include circuitry 560 that may optionally provide a processing element 561 to share or solely process data regarding the function of auto-tuning module 500 as well as data and control signals 570 between the auto-tuning module 500 and circuitry 560 and/or other elements of the signal broadcasting device 550. The circuitry 560 of the signal generation device 550 may further optionally include one or more non-transitory memory elements 562 to store data relating to the auto-tuning module 500 and an optional power element 563 which may supply power to the auto-tuning module 500.

Figure 6A:
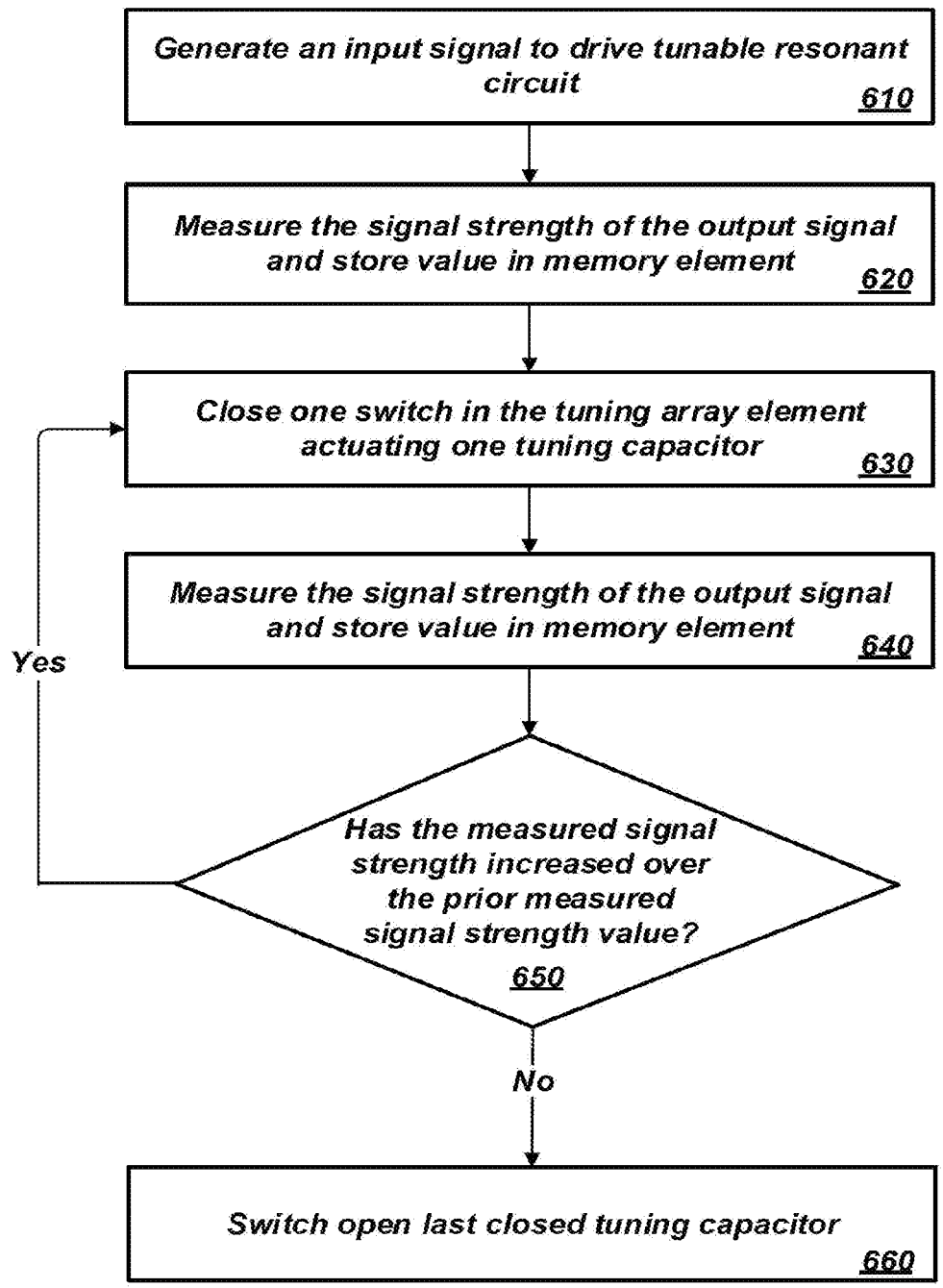
FIG. 6A illustrates one embodiment of a method for generating tuned output signals in accordance with aspects of the disclosure.

Turning to FIG. 6A, a flow chart describing an auto-tuning method 600 in keeping with the present disclosure is disclosed. In method 600, a first step 610 may include generating an input signal, which may be a square wave, to drive the tunable resonant circuit, such as input signal 410 of tunable resonant circuit of FIG. 4. In a step 620, the signal strength of the output signal is measured, and the measured value may be stored in a non-transitory memory element. For instance, the output signal may be the output signal 540 of tunable resonant circuit 510 of FIG. 5 that may be received at sensing element 521 of control element 520 and further stored in memory element 524. In a step 630, one tuning capacitor of the tuning array element (e.g., capacitors 432a-432n of tuning array element 530 of FIG. 4) may be actuated by closing its paired switch (e.g., switch 434a-434n). In a step 640, the signal strength of the output signal may again be measured, and the measured value may be stored in a non-transitory memory element. For instance, again the output signal may be the output signal 540 of tunable resonant circuit 510 of FIG. 5 that may be received at sensing element 521 of control element 520 and further stored in memory element 524. In a step 650, a decision may be made as to whether the newly measured output signal has increased in strength over the prior output signal measurement. If the output signal has increased in signal strength, the method 600 may repeat back at step 630. If the output signal has decreased in signal strength, method 600 may continue to step 660 wherein the last closed tuning capacitor of the tuning array may be switched open.

It should be noted that auto-tuning modules associated with methods described herein, such as method 600, may have a tuning element array with a limited number of tuning capacitors and switch pairings and therefore a limited output signal tuning range. For instance, the auto-tuning module may limit the tuning range to ensure the generated output signal is kept in a range that is safe for human exposure. Likewise, the auto-tuning module may intentionally limit the tuning range to produce output signals in a frequency range significant to the particular use of the signal generation device. In some use scenarios, optimum tuning may occur beyond the tuning range of the particular auto-tuning module embodiment. In such scenarios, the auto-tuning method may approximate the closest optimum tuning. For instance, the auto-tuning module may close all switches such that all tuning capacitors are in circuit or open all switches such that all capacitors will be out of circuit depending on which best approximates the optimum out of range tuning. Likewise, in some method embodiments, a tuning method may begin with all the switches of the tuning element array closed rather than open as described in method 600 of FIG. 6A. Such methods may then tune by progressively opening the switches rather than closing the switches to find optimal tuning in a manner similar to method 600 of FIG. 6A.

In some method embodiments, such as with method 600 of FIG. 6A, once the optimized tuning is found, the method may stop either permanently or for a defined time period. In other embodiments, the method may continually repeat at the step of closing one switch in the tuning array element to actuate one tuning capacitor (e.g. step 630 of FIG. 6A) so as to continually evaluate and optimize the output signal.

Embodiments of the auto-tuning modules of the present disclosure may experience tuning drift due to a variety of issue: varying temperatures, component degradation of the module itself, and/or a variety of local environment conditions (e.g., soil conditions, presence of rain and moisture, and/or the presence of pipes and/or rebar and/or other conductive elements in the use environment).

Figure 6B:
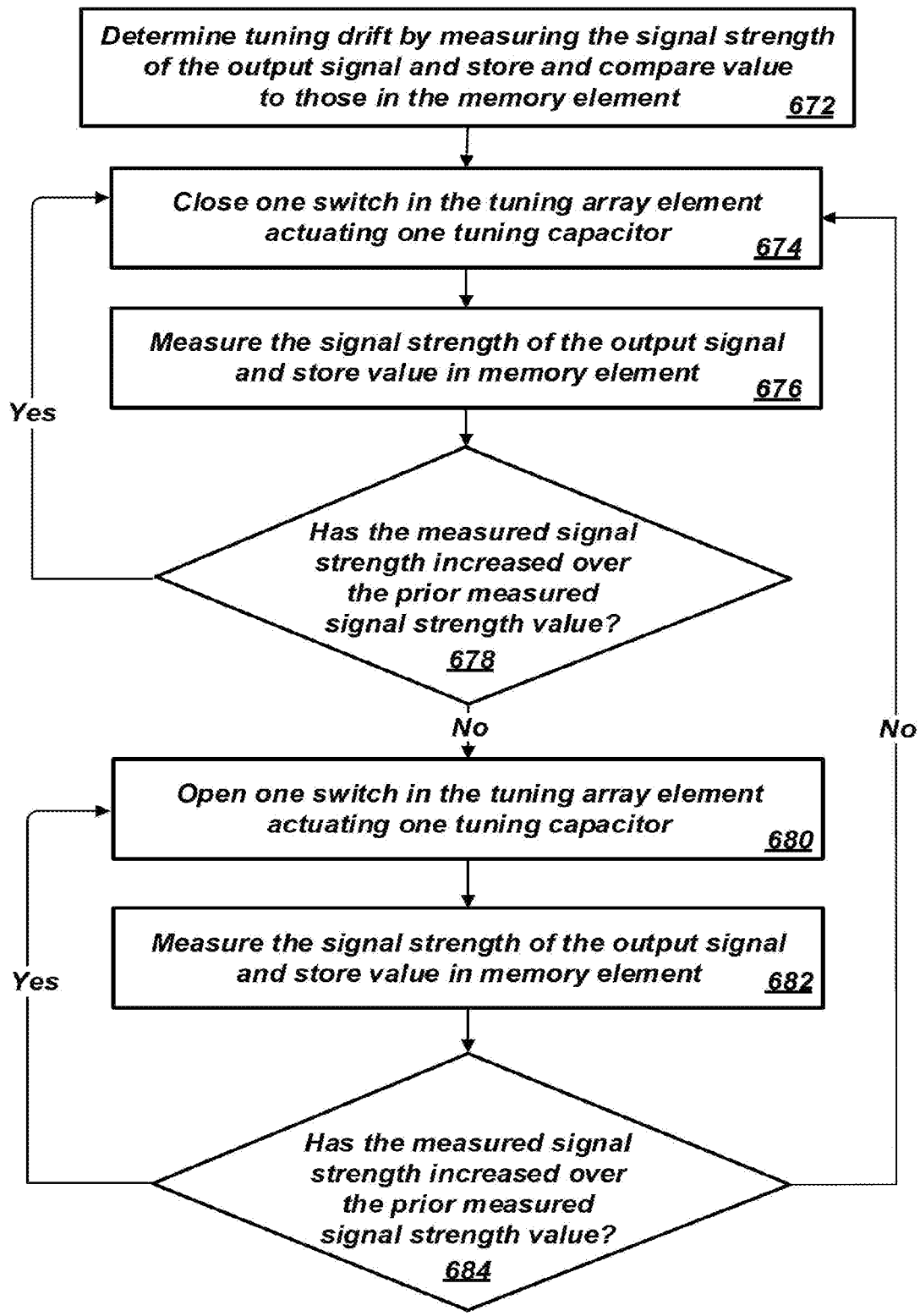
FIG. 6B illustrates one embodiment of a method for tuning output signals when tuning drift has occurred, in accordance with aspects of the disclosure.

A method 670 as shown in FIG. 6B may compensate for such tuning drift. In method 670, a first step 672 may include determining tuning drift by measuring the signal strength of the output signal and storing and comparing against those in the memory element (e.g., comparing via processing element 523 to those values stored in memory element 524 of FIG. 5). In a step 674, one tuning capacitor of the tuning array element (e.g., capacitors 432a-432n of tuning array element 530 of FIG. 4) may be actuated by closing its paired switch (e.g., switch 434a-434n). In a step 676, the signal strength of the output signal may again be measured, and the measured value may be stored in a non-transitory memory element such as memory element 524 of FIG. 5. In a step 678, a decision may be made as to whether the output signal strength has increased. If the output signal has increased in signal strength, the method 670 may repeat back at step 674. If the output signal has decreased in signal strength, method 670 may continue to step 680 wherein one switch of the tuning array element may be opened. In a step 682, the signal strength of the output signal may again be measured, and the measured value may be stored in a non-transitory memory element. In a step 684, a decision may be made as to whether the output signal strength has increased. If the output signal has increased in signal strength, the method 670 may repeat back at step 680. If the output signal has decreased in signal strength, method 670 may continue to step 674. The method may repeat until tuning drift has been corrected.

In some applications, a differential or symmetrical circuit topology may be preferred such as that which may be used in transmitter 125 of FIG. 1 and further disclosed in U.S. Pat. No. 7,276,910, issued Oct. 2, 2007, entitled A COMPACT SELF-TUNED ELECTRICAL RESONATOR FOR BURIED OBJECT LOCATOR APPLICATION and U.S. Pat. No. 9,632,199, issued Apr. 25, 2017, entitled INDUCTIVE CLAMP DEVICES, SYSTEMS, AND METHODS of the incorporated applications.

Figure 7:
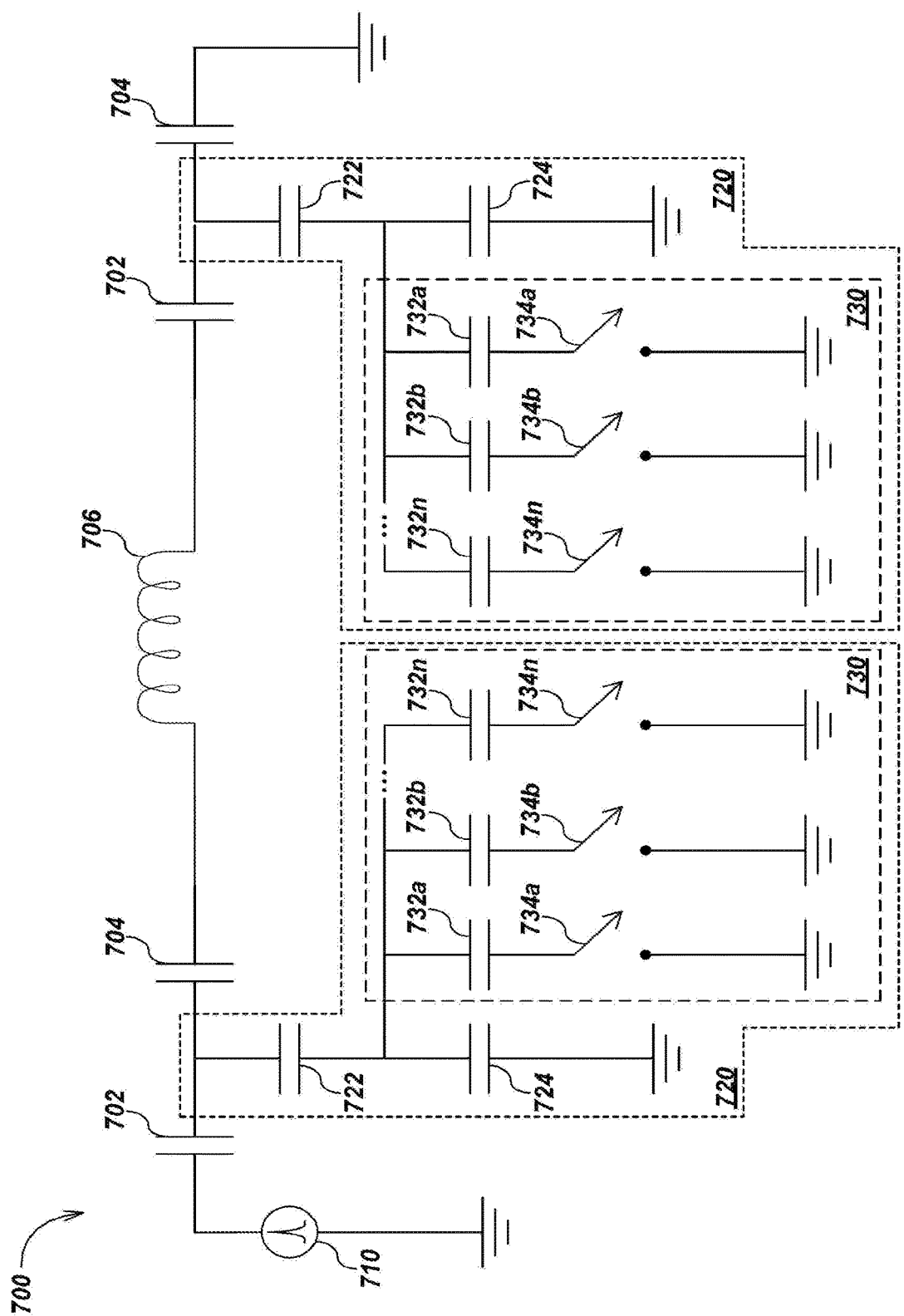
FIG. 7 illustrates another embodiment of a tunable resonant circuit which may be used in an auto-tuning module in accordance with aspects of the disclosure.

Turning to FIG. 7, a tunable resonant circuit 700 for use in an auto-tuning module in keeping with the present disclosure is illustrated having such a differential topology. The tunable resonant circuit element 700 may include a pair of capacitors 702 and 704 on either side of inductor 706 driven by a single-ended pulse input signal 710. Circuit 700 further includes a pair of symmetrical capacitive voltage divider elements 720 and symmetrical tuning array elements 730. Each of the symmetrical capacitive voltage divider elements 720 may include a capacitor 722 dividing against a capacitor 724 and an array of switched capacitors (e.g., capacitors 732a-732n) in a tuning array element 730.

Each of the symmetrical tuning array elements 730 may include a series of tuning capacitors 732a-732n each mated with a switch 734a-734n. The capacitors 732a-732n in the symmetrical tuning array elements 730 may have a range of different capacitance values wherein the capacitors 732a-732n may be actuated (e.g., by closing the associated switches 734a-734n) in increasingly large capacitance value order during tuning of circuit 700. Such a tuning arrangement may allow for lower possible voltage at the later actuated, large capacitance value capacitors than the earlier actuated, smaller capacitance value capacitors. As such, the capacitors in the tuning array element (e.g., capacitors 732a-732n in tuning array element 730) may advantageously be rated for progressively lower and lower voltage as the order in which they are actuated further allowing for such components to be of lower cost with a smaller physical package. The effective capacitance and thereby resonant frequency of the circuit 700 may be impacted by the number of capacitors 732a-732n actuated in the tuning array element 730 in combination with the capacitance values of other tuning capacitors in the circuit (e.g., capacitor 702, 704 and 722). It should also be noted that tuning may begin with either all switches in the tuning array element opened (e.g., such as described with method 600 of FIG. 6A) or with all switches in the tuning array element closed and tuning may occur through opening switches. Alternative embodiments may include circuit topographies having any different numbers of capacitors both in and out of the tuning array element having various capacitance values. In an auto-tuning module in keeping with the present disclosure, the tunable resonant circuit 700 may further be substituted for circuit 510 in FIG. 5A.

In some applications, a circuit topology having a number of tuned stages may be preferred such as that which may be used in exciter device 140 of FIG. 1 further disclosed in U.S. Pat. No. 9,746,572, issued Aug. 29, 2017, entitled ELECTRONIC MARKER DEVICES AND SYSTEMS of the incorporated applications.

Figure 8:
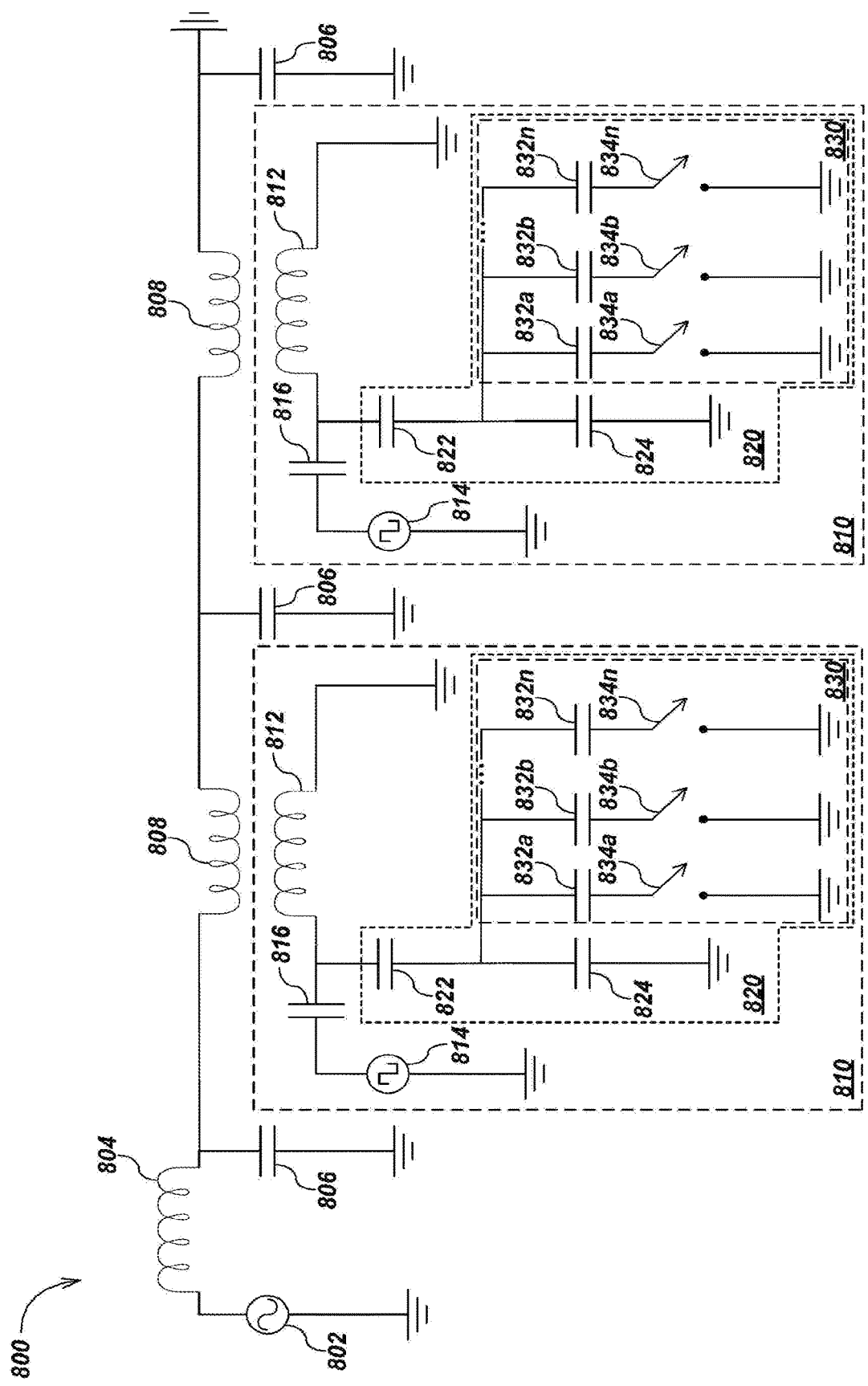
FIG. 8 illustrates another embodiment of a tunable resonant circuit which may be used in an auto-tuning module in accordance with aspects of the disclosure.

Turning to FIG. 8, a tunable resonant circuit 800 for use in an auto-tuning module in keeping with the present disclosure is disclosed having a number of tuning stages. The tunable resonant circuit element 800 may have an input signal 802 driving an inductor 804 and a number of tuning stage elements 810 each separated by a capacitor 806 in parallel. There are two tuned stage elements 810 illustrated in FIG. 8 though in other circuit embodiments other numbers of stages may be included.

Each tuning stage element 810 may have a coil 812 arranged with a coil 808 between each parallel capacitor 806 in a one to one transformer arrangement. The tuning stage elements 810 may have an input signal 814, which may be (but not limited to) a square wave, driving to a capacitor 816 in series with coil 812. On a branch tapped between the capacitor 816 and coil 812, the circuit 800 may include a capacitive voltage divider element 820 which may include a capacitor 822 dividing a capacitor 824 and an array of switched capacitors (e.g., capacitors 832a-832n) in a tuning array elements 830. Each of the tuning array elements 830 may include a series of tuning capacitors 832a-832n each mated with a switch 834a-834n. The capacitors 832a-832n in the tuning array element 830 may have a range of different capacitance values wherein the capacitors 832a-832n may be actuated (e.g., by closing the associated switches 834a-834n) in increasingly large capacitance value order during tuning of each tuning stage element 810. Such a tuning arrangement may allow for lower possible voltage at the later actuated, large capacitance value capacitors than the earlier actuated, smaller capacitance value capacitors. As such, the capacitors in the tuning array element (e.g., capacitors 832a-832n in tuning array element 830) may advantageously be rated for progressively lower and lower voltage as the order in which they are actuated further allowing for such components to be of lower cost with a smaller physical package. The effective capacitance and thereby resonant frequency of each tuning stage element 810 may be impacted by the number of capacitors 832a-834n actuated in the tuning array element 830 in combination with the capacitance values of other tuning capacitors in the circuit (e.g., capacitor 816 and capacitor 822). It should also be noted that tuning may begin with either all switches in the tuning array element opened (e.g., such as described with method 600 of FIG. 6A) or with all switches in the tuning array element closed and tuning may occur through opening switches. Various tuning array element embodiments in keeping with the present disclosure may include different numbers of capacitor and switch pairings rated for different capacitance. Likewise, a tunable resonant circuit having different tuned stages, such as tunable resonant circuit 800, may have a different number of tuned stages. In an auto-tuning module in keeping with the present disclosure, the tunable resonant circuit 800 may further be substituted for circuit 510 in FIG. 5.

It is understood that the specific order or hierarchy of steps or stages in the processes and methods disclosed herein are examples of exemplary approaches. Based upon design preferences, it is understood that the specific order or hierarchy of steps or stages in the processes may be rearranged while remaining within the scope of the present disclosure. Any accompanying method claims present elements of the various steps in a sample order and are not meant to be limited to the specific order or hierarchy presented unless explicitly noted.

Those of skill would further appreciate that the various illustrative logical blocks, modules, circuits and algorithm steps described in connection with the embodiments disclosed herein may be implemented as electronic hardware, computer software or combinations of both. To clearly illustrate this interchangeability of hardware and software, various illustrative components, blocks, modules, circuits and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The various illustrative logical blocks, modules, and circuits described in connection with the embodiments disclosed herein and, for example, in processing elements as described herein may be implemented or performed with a general purpose processor, a digital signal processor (DSP), an application specific integrated circuit (ASIC), a field programmable gate array (FPGA) or other programmable logic device, discrete gate or transistor logic, discrete hardware components or any combination thereof designed to perform the functions described herein. A general purpose processor may be a microprocessor, but in the alternative, the processor may be any conventional processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration. A processing element may further include or be coupled to one or more memory elements for storing instructions, data and/or other information in a non-transitory digital storage format.

The steps or stages of a method, process or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, CD-ROMs or any other form of storage medium known or developed in the art. An exemplary storage medium is coupled to the processor such that the processor can read information from and write information to the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The scope of the disclosure is not intended to be limited to the aspects shown herein, but is to be accorded the full scope consistent with the language of this specification and accompanying drawings, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use embodiments of the present invention. Various modifications to these aspects will be readily apparent to those skilled in the art, and the generic principles defined herein may be applied to other aspects without departing from the spirit or scope of the invention. Thus, the scope of the invention is not intended to be limited to the aspects shown herein but is to be accorded the widest scope consistent with the following claims and their equivalents.

We claim:

1. A buried utility locator, comprising:

One or more omnidirectional magnetic antenna nodes;

And a receiver circuit operatively coupled to the omnidirectional antenna nodes, comprising:
 an auto-tuning electronic circuit module for generating tuned output signals, comprising:
 a tunable resonant electronic circuit element comprising a first capacitor and an inductor in series driven by an input signal which is a square wave at a resonant frequency for providing a tuned output signal;
 a capacitive voltage divider circuit coupled between the first capacitor and inductor;
 a tuning array element circuit coupled between capacitors of the capacitive divider circuit, the tuning array element including a plurality of tuning capacitors and mated switches; and
 a control element including a sensing element for measuring output signal strength and a processing element for comparing previous output signal strength values stored in a non-transitory memory element to a current signal strength value and providing a corresponding control signal to control actuation of the mated switches.

2. A method for detecting buried utilities, comprising:
  receiving, at one or more omnidirectional antenna nodes; and
  processing output signals from the omnidirectional antenna nodes in an auto-tuning circuit module as recited in claim 1 to provide a tuned output signal.

3. The locator of claim 1, wherein the tuning array element comprises tuning inductors and associated mated switches instead of tuning capacitors and associated mated switches.

4. The locator of claim 1, wherein ones of the plurality of tuning capacitors have different capacitive values than other of the plurality of tuning capacitors.

5. The locator of claim 3, wherein the tuning capacitors are actuated in increasing capacitance value during tuning of the circuit.

6. The locator of claim 5, wherein the tuning capacitors have progressively lower voltage ratings based on the order they are actuated.

7. The locator of claim 1, wherein the tuning begins with all of the switches opened.

8. The locator of claim 1, wherein the tuning begins with all of the switches closed.

9. The locator of claim 1, wherein two or more of the tuning capacitors have a value of about 1 Farad or more.

10. The locator of claim 1, further comprising a plurality of voltage divisions in the capacitive divider circuit.

11. The locator of claim 1, wherein the tuning circuit is a parallel tuning circuit rather than a series tuning circuit.

12. The locator of claim 1, wherein the control element includes an analog-to-digital converter (ADC) operatively coupled to the sensing element to convert the analog sensed signal to a digital output signal.

13. The locator of claim 12, wherein the processing element compares the ADC digital output signal to output signal stored in the non-transitory memory to generate the control signals.

14. The locator of claim 1, further comprising a power element to provide power to the auto-tuning electronic circuit module.

15. The locator of claim 1, wherein the processing element is located external to the auto-tuning electronic circuit module.

* * * * *